United States Patent
Tang

(10) Patent No.: US 10,319,301 B2
(45) Date of Patent: Jun. 11, 2019

(54) OLED DISPLAY DEVICE AND MANUFACTURE METHOD THEREOF

(71) Applicant: Wuhan China Star Optoelectronics Technology Co., Ltd., Wuhan (CN)

(72) Inventor: Jinming Tang, Wuhan (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 151 days.

(21) Appl. No.: 15/505,105

(22) PCT Filed: Dec. 30, 2016

(86) PCT No.: PCT/CN2016/113320
§ 371 (c)(1),
(2) Date: Feb. 20, 2017

(87) PCT Pub. No.: WO2018/119965
PCT Pub. Date: Jul. 5, 2018

(65) Prior Publication Data
US 2018/0226024 A1 Aug. 9, 2018

(30) Foreign Application Priority Data

Dec. 27, 2016 (CN) .......................... 2016 1 1227254

(51) Int. Cl.
*G09G 3/30* (2006.01)
*G09G 3/3241* (2016.01)
(Continued)

(52) U.S. Cl.
CPC ........ *G09G 3/3241* (2013.01); *H01L 27/3211* (2013.01); *H01L 27/3216* (2013.01);
(Continued)

(58) Field of Classification Search
CPC ...... G09G 3/3241; G09G 3/14; G09G 3/3208; H01L 27/3246; H01L 27/3279;
(Continued)

(56) References Cited

U.S. PATENT DOCUMENTS

2005/0116620 A1* 6/2005 Kobayashi .......... H01L 51/5271
313/503
2009/0242911 A1* 10/2009 Ishihara .............. H01L 27/3211
257/89

(Continued)

FOREIGN PATENT DOCUMENTS

| CN | 102891265 A | 1/2013 |
| CN | 103187434 A | 7/2013 |

*Primary Examiner* — Jennifer T Nguyen
(74) *Attorney, Agent, or Firm* — Leong C. Lei

(57) ABSTRACT

The present invention provides an OLED display device and a manufacture method thereof. By respectively configuring the first, second, third PEDOT:PSS conductive film layers in the red, green, blue OLED elements, and setting the first, second, third PEDOT:PSS conductive film layers conductive film layers to have various thicknesses to realize that the luminous efficiencies of the red, green, blue OLED elements respectively achieve the best, and all the first, second, third PEDOT:PSS conductive film layers are manufactured by the ink jet printing method. In comparison with the traditional OLED display device, the thicknesses of the first hole transporting layer, the second hole transporting layer, the third hole transporting layer in the red, green, blue OLED elements are the same in the OLED display device of the present invention, thus they can be formed in the same evaporation process with one common metal mask to eliminate three fine metal masks.

10 Claims, 2 Drawing Sheets

(51) Int. Cl.
   *H01L 27/32*   (2006.01)
   *H01L 51/52*   (2006.01)
   *H01L 51/00*   (2006.01)
   *H01L 51/56*   (2006.01)

(52) U.S. Cl.
   CPC ...... *H01L 27/3218* (2013.01); *H01L 27/3246* (2013.01); *H01L 27/3279* (2013.01); *H01L 51/001* (2013.01); *H01L 51/5212* (2013.01); *H01L 51/5215* (2013.01); *H01L 51/5228* (2013.01); *H01L 51/56* (2013.01)

(58) Field of Classification Search
   CPC ............. H01L 51/5228; H01L 27/3216; H01L 51/5212; H01L 27/3218
   USPC ...................................... 345/76–83
   See application file for complete search history.

(56) References Cited

U.S. PATENT DOCUMENTS

| | | | | |
|---|---|---|---|---|
| 2013/0082248 A1* | 4/2013 | Groarke | .............. | C07F 15/0033 257/40 |
| 2017/0025610 A1* | 1/2017 | Kwon | .................. | H01L 51/0007 |
| 2017/0222173 A1* | 8/2017 | Matsusue | ............ | H01L 51/5044 |

* cited by examiner

OLED DISPLAY DEVICE AND MANUFACTURE METHOD THEREOF

FIELD OF THE INVENTION

The present invention relates to a display technology field, and more particularly to an OLED display device and a manufacture method thereof.

BACKGROUND OF THE INVENTION

The Organic Light Emitting Display (OLED) display, which is also named as Organic electroluminescent display, is a new flat panel display device. Because it possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device in the industry.

Because the OLED display device possesses advantages of self-illumination, simple structure with low cost, fast response speed, wide view angle, high color saturation, high contrast, being light and flexible, more and more smart phones and the wearable devices start using the OLED display device.

The OLED display element generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED element is that the illumination generates due to the carrier injection and recombination under the electric field driving of the semiconductor material and the organic semiconductor illuminating material. Specifically, with a certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

Specifically, the full color display OLED display device generally comprises a plurality of red OLED elements, a plurality of green OLED elements, a plurality of blue OLED elements. The light emitting layers of the red OLED elements, the green OLED elements, the blue OLED elements respectively are red light emitting layers, green light emitting layers, blue light emitting layers. For making the red OLED elements, the green OLED elements, the blue OLED elements respectively achieve the optimized luminous efficiencies, the hole transporting layers of the OLED elements of different colors are set to have different thicknesses to adjust the light distances of the red light, the green light, the blue light. The Fabry-Perot resonance principle is used to calculate the best light distances to make the red light emitting layers, green light emitting layers, blue light emitting layers respectively at the positions of the second antinodes, and thus, the luminous efficiencies reach the maximum. It requires that the hole transporting layers of the red OLED elements, the green OLED elements, the blue OLED elements need to use three different FMMs (Fine Metal Mask) to be manufactured with three evaporation processes. Accordingly, the production cost is increased, and the process time is extended. Meanwhile, the product yield decreases due to the complexity of the process.

SUMMARY OF THE INVENTION

An objective of the present invention is to provide an OLED display device, which can realize that the luminous efficiencies of the red OLED element, the green OLED element, the blue OLED element respectively achieve the best, and the production cost is low and the process is simple.

Another objective of the present invention is to provide a manufacture method of an OLED display device, which can realize that the luminous efficiencies of the red OLED element, the green OLED element, the blue OLED element respectively achieve the best, and the production cost is low and the process is simple.

For realizing the aforesaid objectives, the present invention provides an OLED display device, comprising a substrate, a pixel definition layer located on the substrate, a plurality of through holes located in the pixel definition layer, and a plurality of red OLED elements, a plurality of green OLED elements and a plurality of blue OLED elements, which are respectively located in the plurality of through holes;

the red OLED element comprising a first transparent conductive metal oxide layer, a first metal layer, a first PEDOT:PSS conductive film layer, a second transparent conductive metal oxide layer, a first hole injection layer, a first hole transporting layer, a red light emitting layer, a first electron transporting layer and a first cathode on the substrate from bottom to top in order; the first transparent conductive metal oxide layer, the first metal layer, the first PEDOT:PSS conductive film layer and the second transparent conductive metal oxide layer constituting a first anode, together;

the green OLED element comprising a third transparent conductive metal oxide layer, a second metal layer, a second PEDOT:PSS conductive film layer, a fourth transparent conductive metal oxide layer, a second hole injection layer, a second hole transporting layer, a green light emitting layer, a second electron transporting layer and a second cathode on the substrate from bottom to top in order; the third transparent conductive metal oxide layer, the second metal layer, the second PEDOT:PSS conductive film layer and the fourth transparent conductive metal oxide layer constituting a second anode, together;

the blue OLED element comprising a fifth transparent conductive metal oxide layer, a third metal layer, a third PEDOT:PSS conductive film layer, a sixth transparent conductive metal oxide layer, a third hole injection layer, a third hole transporting layer, a blue light emitting layer, a third electron transporting layer and a third cathode on the substrate from bottom to top in order; the fifth transparent conductive metal oxide layer, the third metal layer, the third PEDOT:PSS conductive film layer and the sixth transparent conductive metal oxide layer constituting a third anode, together.

Materials of the first PEDOT:PSS conductive film layer, the second PEDOT:PSS conductive film layer, the third PEDOT:PSS conductive film layer are the same, and a refractive index thereof is $\eta_P$, and materials of the second transparent conductive metal oxide layer, the fourth transparent conductive metal oxide layer, the sixth transparent conductive metal oxide layer are the same, and a refractive index thereof is $\eta_I$, and materials of the first hole injection layer, the second hole injection layer, the third hole injection layer are the same, and a refractive index thereof is $\eta_J$, and materials of the first hole transporting layer, the second hole transporting layer, the third hole transporting layer are the same, and a refractive index thereof is $\eta_T$, and a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$;

a thickness of the first PEDOT:PSS conductive film layer is defined to be $d_{RP}$, and a thickness of the second transparent conductive metal oxide layer is defined to be $d_{RI}$, and a thickness of the first hole injection layer is defined to be $d_{RJ}$, and a thickness of the first hole transporting layer is defined to be $d_{RT}$, and a relation of $d_{RP}$, $d_{RI}$, $d_{RJ}$, $d_{RT}$ satisfies a relationship (1):

$$\eta_P{}^*d_{RP}+\eta_I{}^*d_{RI}+\eta_J{}^*d_{RJ}+\eta_T{}^*d_{RT}=(2m_R+1)\lambda_R/4; \quad (1)$$

wherein $m_R$ is a natural number;

a thickness of the second PEDOT:PSS conductive film layer is defined to be $d_{GP}$, and a thickness of the fourth transparent conductive metal oxide layer is defined to be $d_{GI}$, and a thickness of the second hole injection layer is defined to be $d_{GJ}$, and a thickness of the second hole transporting layer is defined to be $d_{GT}$, and a relation of $d_{GP}$, $d_{GI}$, $d_{GJ}$, $d_{GT}$ satisfies a relationship: (2):

$$\eta_P{}^*d_{GP}+\eta_I{}^*d_{GI}+\eta_J{}^*d_{GJ}+\eta_T{}^*d_{GT}=(2m_G+1)\lambda_G/4 \quad (2)$$

wherein $m_G$ is a natural number;

a thickness of the third PEDOT:PSS conductive film layer is defined to be $d_{BP}$, and a thickness of the sixth transparent conductive metal oxide layer is defined to be $d_{BI}$, and a thickness of the third hole injection layer is defined to be $d_{BJ}$, and a thickness of the third hole transporting layer is defined to be $d_{BT}$, and a relation of $d_{BP}$, $d_{BI}$, $d_{BJ}$, $d_{BT}$ satisfies a relationship (3):

$$\eta_P{}^*d_{BP}+\eta_I{}^*d_{BI}+\eta_J{}^*d_{BJ}+\eta_T{}^*d_{BT}=(2m_B+1)\lambda_B/4 \quad (3)$$

wherein $m_B$ is a natural number;

and $d_{RI}=d_{GI}=d_{BI}$, $d_{RJ}=d_{GJ}=d_{BJ}$, $d_{RT}=d_{GT}=d_{BT}$, $m_R=m_G=m_B$, and $\lambda_R$, $\lambda_G$, $\lambda_B$ are unequal, and thus, $d_{RP}$, $d_{GP}$, $d_{BP}$ are unequal.

The plurality of through holes in the pixel definition layer appear to be tapered, and a dimension of the through hole gradually increases from one end away from the substrate to one end close to the substrate.

The red light emitting layer comprises a main material and a doped dye, and the main material is CBP, and the doped dye is red phosphorescent dye, and the red phosphorescent dye is Ir(DBQ)$_2$(acac);

the green light emitting layer comprises a main material and a doped dye, and the main material is CBP, and the doped dye is green phosphorescent dye, and the green phosphorescent dye is Ir(ppy)$_3$;

the blue light emitting layer comprises a main material and a doped dye, and the main material is AND, and the doped dye is blue fluorescent dye, and the blue fluorescent dye is BUBD-1;

a constitutional formula of CBP is

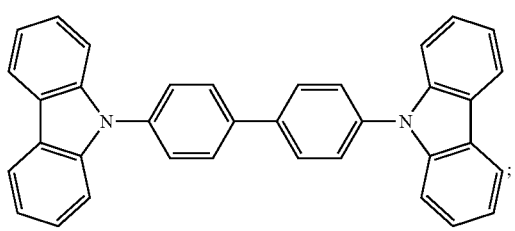 [SMILES: c1ccc2c(c1)c1ccccc1n2-c1ccc(-c2ccc(-n3c4ccccc4c4ccccc43)cc2)cc1]

a constitutional formula of Ir(DBQ)$_2$(acac) is

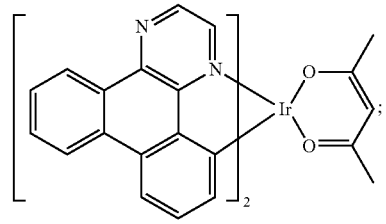

a constitutional formula of Ir(ppy)$_3$ is

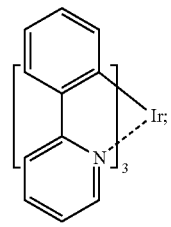

a constitutional formula of BUBD-1 is

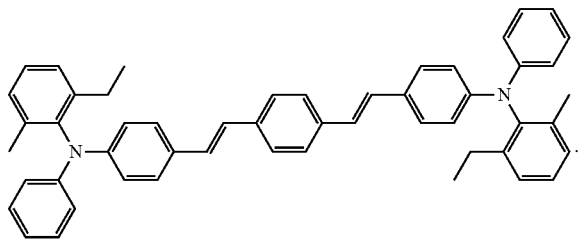

Materials of the first transparent conductive metal oxide layer, the second transparent conductive metal oxide layer, the third transparent conductive metal oxide layer, the fourth transparent conductive metal oxide layer, the fifth transparent conductive metal oxide layer, the sixth transparent conductive metal oxide layer are tin indium oxide, and materials of the first metal layer, the second metal layer, the third metal layer are silver;

materials of the first cathode, the second cathode, the third cathode are the same, and comprise at least one of low work function metal, alloy formed by low work function metal and at least one of copper, gold, and silver, low work function metal nitride and low work function metal fluoride; the low work function metal comprises at least one of lithium, magnesium, calcium, strontium, aluminum and indium;

materials of the first hole injection layer, the second hole injection layer, the third hole injection layer comprise HAT(CN)$_6$, and a constitutional formula of HAT(CN)$_6$ is

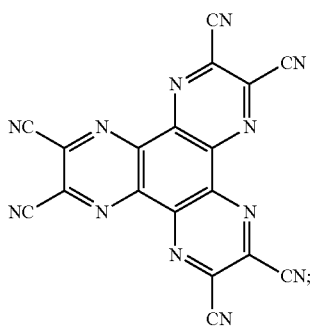 [SMILES: N#Cc1nc2c3nc(C#N)c(C#N)nc3c3nc(C#N)c(C#N)nc3c2nc1C#N]

materials of the first electron transporting layer, the second electron transporting layer, the third electron transporting layer are the same, and comprise BPhen, and a constitutional formula of BPhen is

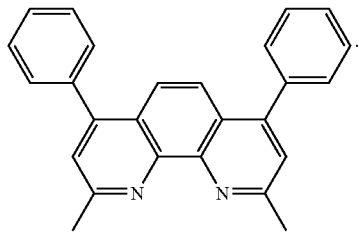 [SMILES: Cc1cc(-c2ccccc2)c2ccc3c(-c4ccccc4)cc(C)nc3c2n1]

The present invention further provides a manufacture method of an OLED display device, comprising steps of:

step 1, providing a substrate, and forming a pixel definition layer on the substrate, and configuring a plurality of through holes which are separately located in the pixel definition layer, and the plurality of through holes defining a plurality of red pixel regions, a plurality of green pixel regions and a plurality of blue pixel regions on the substrate;

respectively forming a first transparent conductive metal oxide layer, a third transparent conductive metal oxide layer, a fifth transparent conductive metal oxide layer in the red pixel region, the green pixel region and the blue pixel region of the substrate;

respectively forming a first metal layer, a second metal layer, a third metal layer on the first transparent conductive metal oxide layer, the third transparent conductive metal oxide layer, the fifth transparent conductive metal oxide layer;

respectively coating PEDOT:PSS aqueous solution on the first metal layer, the second metal layer and the third metal layer, and forming a first PEDOT:PSS conductive film layer, a second PEDOT:PSS conductive film layer, a third PEDOT:PSS conductive film layer after curing and removing moisture;

respectively depositing a second transparent conductive metal oxide layer, a fourth transparent conductive metal oxide layer, a sixth transparent conductive metal oxide layer on the first PEDOT:PSS conductive film layer, the second PEDOT:PSS conductive film layer, the third PEDOT:PSS conductive film layer;

in the red pixel region, the first transparent conductive metal oxide layer, the first metal layer, the first PEDOT:PSS conductive film layer and the second transparent conductive metal oxide layer which are stacked up from bottom to top in order constituting a first anode, together;

in the green pixel region, the third transparent conductive metal oxide layer, the second metal layer, the second PEDOT:PSS conductive film layer and the fourth transparent conductive metal oxide layer which are stacked up from bottom to top in order constituting a second anode, together;

in the blue pixel region, the fifth transparent conductive metal oxide layer, the third metal layer, the third PEDOT:PSS conductive film layer and the sixth transparent conductive metal oxide layer which are stacked up from bottom to top in order constituting a third anode, together;

step 2, cleaning the first anode, the second anode and the third anode;

step 3, respectively evaporating a first hole injection layer, a second hole injection layer, a third hole injection layer on the first anode, the second anode and the third anode in the same evaporation process;

respectively evaporating a first hole transporting layer, a second hole transporting layer, a third hole transporting layer on the first hole injection layer, the second hole injection layer, the third hole injection layer in the same evaporation process;

respectively evaporating a red light emitting layer, a green light emitting layer, a blue light emitting layer on the first hole transporting layer, the second hole transporting layer, the third hole transporting layer in three different evaporation processes;

respectively evaporating a first electron transporting layer, a second electron transporting layer, a third electron transporting layer on the red light emitting layer, the green light emitting layer, the blue light emitting layer in the same evaporation process;

respectively evaporating a first cathode, a second cathode, a third cathode on the first electron transporting layer, the second electron transporting layer, the third electron transporting layer in the same evaporation process;

and forming red OLED elements, green OLED elements and blue OLED elements respectively corresponding to the red pixel regions, the green pixel regions, the blue pixel regions in the plurality of through holes of the pixel definition layer.

Materials of the first PEDOT:PSS conductive film layer, the second PEDOT:PSS conductive film layer, the third PEDOT:PSS conductive film layer are the same, and a refractive index thereof is $\eta_P$, and materials of the second transparent conductive metal oxide layer, the fourth transparent conductive metal oxide layer, the sixth transparent conductive metal oxide layer are the same, and a refractive index thereof is $\eta_I$, and materials of the first hole injection layer, the second hole injection layer, the third hole injection layer are the same, and a refractive index thereof is $\eta_J$, and materials of the first hole transporting layer, the second hole transporting layer, the third hole transporting layer are the same, and a refractive index thereof is $\eta_T$, and a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$;

a thickness of the first PEDOT:PSS conductive film layer is defined to be $d_{RP}$, and a thickness of the second transparent conductive metal oxide layer is defined to be $d_{RI}$, and a thickness of the first hole injection layer is defined to be $d_{RJ}$, and a thickness of the first hole transporting layer is defined to be $d_{RT}$, and a relation of $d_{RP}$, $d_{RI}$, $d_{RJ}$, $d_{RT}$ satisfies a relationship (1):

$$\eta_P*d_{RP}+\eta_I*d_{RI}+\eta_J*d_{RJ}+\eta_T*d_{RT}=(2m_R+1)\lambda_R/4 \quad (1);$$

wherein $m_R$ is a natural number;

a thickness of the second PEDOT:PSS conductive film layer is defined to be $d_{GP}$, and a thickness of the fourth transparent conductive metal oxide layer is defined to be $d_{GP}$, and a thickness of the second hole injection layer is defined to be $d_{GJ}$, and a thickness of the second hole transporting layer is defined to be $d_{GT}$, and a relation of $d_{GP}$, $d_{GI}$, $d_{GJ}$, $d_{GT}$ satisfies a relationship (2):

$$\eta_P{}^*d_{GP}+\eta_I{}^*d_{GI}+\eta_J{}^*d_{GJ}+\eta_T{}^*d_{GT}=(2m_G+1)\lambda_G/4 \qquad (2);$$

wherein $m_G$ is a natural number;

a thickness of the third PEDOT:PSS conductive film layer is defined to be $d_{BP}$, and a thickness of the sixth transparent conductive metal oxide layer is defined to be $d_{BI}$, and a thickness of the third hole injection layer is defined to be $d_{BJ}$, and a thickness of the third hole transporting layer is defined to be $d_{BT}$, and a relation of $d_{BP}$, $d_{BI}$, $d_{BJ}$, $d_{BT}$ satisfies a relationship (3):

$$\eta_P{}^*d_{BP}+\eta_I{}^*d_{BI}+\eta_J{}^*d_{BJ}+\eta_T{}^*d_{BT}=(2m_B+1)\lambda_B/4 \qquad (3);$$

wherein $m_B$ is a natural number;

and $d_{RI}=d_{GI}=d_{BI}$, $d_{RJ}=d_{GJ}=d_{BJ}$, $d_{RT}=d_{GT}=d_{BT}$, $m_R=m_G=m_B$, and $\lambda_R$, $\lambda_G$, $\lambda_B$ are unequal, and thus, $d_{RP}$, $d_{GP}$, $d_{BP}$ are unequal.

The plurality of through holes in the pixel definition layer appear to be tapered, and a dimension of the through hole gradually increases from one end away from the substrate to one end close to the substrate.

in step 1, a magnetron sputtering method is used to deposit the first transparent conductive metal oxide layer, the second transparent conductive metal oxide layer, the third transparent conductive metal oxide layer, the fourth transparent conductive metal oxide layer, the fifth transparent conductive metal oxide layer, the sixth transparent conductive metal oxide layer, and the first metal layer, the second metal layer, the third metal layer are silver;

an ink jet printing method is used to respectively coat PEDOT:PSS aqueous solution on the first metal layer, the second metal layer and the third metal layer.

The red light emitting layer comprises a main material and a doped dye, and the main material is CBP, and the doped dye is red phosphorescent dye, and the red phosphorescent dye is Ir(DBQ)$_2$(acac);

the green light emitting layer comprises a main material and a doped dye, and the main material is CBP, and the doped dye is green phosphorescent dye, and the green phosphorescent dye is Ir(ppy)$_3$;

the blue light emitting layer comprises a main material and a doped dye, and the main material is AND, and the doped dye is blue fluorescent dye, and the blue fluorescent dye is BUBD-1;

a constitutional formula of CBP is

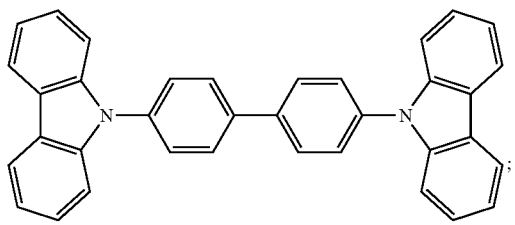 [SMILES: c1ccc2c(c1)c1ccccc1n2-c1ccc(-c2ccc(-n3c4ccccc4c4ccccc43)cc2)cc1]

a constitutional formula of Ir(DBQ)$_2$(acac)

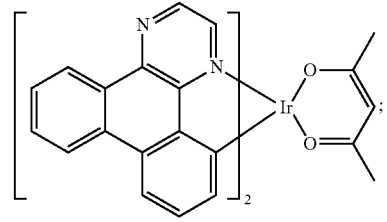

a constitutional formula of Ir(ppy)$_3$ is

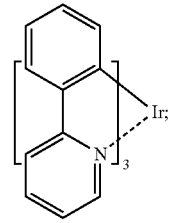

a constitutional formula of BUBD-1 is

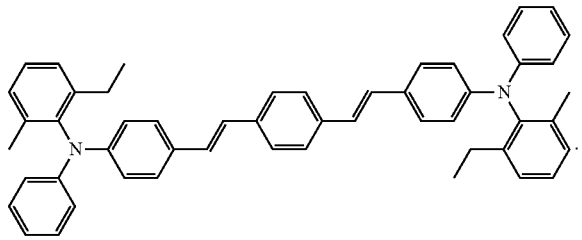 [SMILES: CCc1cccc(C)c1N(c1ccccc1)c1ccc(/C=C/c2ccc(/C=C/c3ccc(N(c4ccccc4)c4c(C)cccc4CC)cc3)cc2)cc1]

The present invention further provides a manufacture method of an OLED display device, comprising steps of:

step 1, providing a substrate, and forming a pixel definition layer on the substrate, and configuring a plurality of through holes which are separately located in the pixel definition layer, and the plurality of through holes defining a plurality of red pixel regions, a plurality of green pixel regions and a plurality of blue pixel regions on the substrate;

respectively forming a first transparent conductive metal oxide layer, a third transparent conductive metal oxide layer, a fifth transparent conductive metal oxide layer in the red pixel region, the green pixel region and the blue pixel region of the substrate;

respectively forming a first metal layer, a second metal layer, a third metal layer on the first transparent conductive metal oxide layer, the third transparent conductive metal oxide layer, the fifth transparent conductive metal oxide layer;

respectively coating PEDOT:PSS aqueous solution on the first metal layer, the second metal layer and the third metal layer, and forming a first PEDOT:PSS conductive film layer, a second PEDOT:PSS conductive film layer, a third PEDOT: PSS conductive film layer after curing and removing moisture;

respectively depositing a second transparent conductive metal oxide layer, a fourth transparent conductive metal oxide layer, a sixth transparent conductive metal oxide layer on the first PEDOT:PSS conductive film layer, the second PEDOT:PSS conductive film layer, the third PEDOT:PSS conductive film layer;

in the red pixel region, the first transparent conductive metal oxide layer, the first metal layer, the first PEDOT:PSS conductive film layer and the second transparent conductive metal oxide layer which are stacked up from bottom to top in order constituting a first anode, together;

in the green pixel region, the third transparent conductive metal oxide layer, the second metal layer, the second PEDOT:PSS conductive film layer and the fourth transparent conductive metal oxide layer which are stacked up from bottom to top in order constituting a second anode, together;

in the blue pixel region, the fifth transparent conductive metal oxide layer, the third metal layer, the third PEDOT:PSS conductive film layer and the sixth transparent conductive metal oxide layer which are stacked up from bottom to top in order constituting a third anode, together;

step 2, cleaning the first anode, the second anode and the third anode;

step 3, respectively evaporating a first hole injection layer, a second hole injection layer, a third hole injection layer on the first anode, the second anode and the third anode in the same evaporation process;

respectively evaporating a first hole transporting layer, a second hole transporting layer, a third hole transporting layer on the first hole injection layer, the second hole injection layer, the third hole injection layer in the same evaporation process;

respectively evaporating a red light emitting layer, a green light emitting layer, a blue light emitting layer on the first hole transporting layer, the second hole transporting layer, the third hole transporting layer in three different evaporation processes;

respectively evaporating a first electron transporting layer, a second electron transporting layer, a third electron transporting layer on the red light emitting layer, the green light emitting layer, the blue light emitting layer in the same evaporation process;

respectively evaporating a first cathode, a second cathode, a third cathode on the first electron transporting layer, the second electron transporting layer, the third electron transporting layer in the same evaporation process;

and forming red OLED elements, green OLED elements and blue OLED elements respectively corresponding to the red pixel regions, the green pixel regions, the blue pixel regions in the plurality of through holes of the pixel definition layer;

wherein materials of the first PEDOT:PSS conductive film layer, the second PEDOT:PSS conductive film layer, the third PEDOT:PSS conductive film layer are the same, and a refractive index thereof is $\eta_P$, and materials of the second transparent conductive metal oxide layer, the fourth transparent conductive metal oxide layer, the sixth transparent conductive metal oxide layer are the same, and a refractive index thereof is $\eta_I$, and materials of the first hole injection layer, the second hole injection layer, the third hole injection layer are the same, and a refractive index thereof is $\eta_J$, and materials of the first hole transporting layer, the second hole transporting layer, the third hole transporting layer are the same, and a refractive index thereof is $\eta_T$, and a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$;

a thickness of the first PEDOT:PSS conductive film layer is defined to be $d_{RP}$, and a thickness of the second transparent conductive metal oxide layer is defined to be $d_{RI}$, and a thickness of the first hole injection layer is defined to be $d_{RJ}$, and a thickness of the first hole transporting layer is defined to be $d_{RT}$, and a relation of $d_{RP}$, $d_{RI}$, $d_{RJ}$, $d_{RT}$ satisfies a relationship:

$$\eta_P*d_{RP}+\eta_I*d_{RI}+\eta_J*d_{RJ}+\eta_T*d_{RT}=(2m_R+1)\lambda_R/4;$$

wherein $m_R$ is a natural number;

a thickness of the second PEDOT:PSS conductive film layer is defined to be $d_{GP}$, and a thickness of the fourth transparent conductive metal oxide layer is defined to be $d_{GI}$, and a thickness of the second hole injection layer is defined to be $d_{GJ}$, and a thickness of the second hole transporting layer is defined to be $d_{GT}$, and a relation of $d_{GP}$, $d_{GI}$, $d_{GJ}$, $d_{GT}$ satisfies a relationship:

$$\eta_P*d_{GP}+\eta_I*d_{GI}+\eta_J*d_{GJ}+\eta_T*d_{GT}=(2m_G+1)\lambda_G/4;$$

wherein $m_G$ is a natural number;

a thickness of the third PEDOT:PSS conductive film layer is defined to be $d_BP$, and a thickness of the sixth transparent conductive metal oxide layer is defined to be $d_{BI}$, and a thickness of the third hole injection layer is defined to be $d_{BJ}$, and a thickness of the third hole transporting layer is defined to be $d_{BT}$, and a relation of $d_{BP}$, $d_{BI}$, $d_{BJ}$, $d_{BT}$ satisfies a relationship:

$$\eta_P*d_{BP}+\eta_I*d_{BI}+\eta_J*d_{BJ}+\eta_T*d_{BT}=(2m_B+1)\lambda_B/4;$$

wherein $m_B$ is a natural number;

and $d_{RI}=d_{GI}=d_{BI}$, $d_{RJ}=d_{GJ}=d_{BJ}$, $d_{RT}=d_{GT}=d_{BT}$, $m_R=m_G=m_B$, and $\lambda_R$, $\lambda_G$, $\lambda_B$ are unequal, and thus, $d_{RP}$, $d_{GP}$, $d_{BP}$ are unequal;

wherein the plurality of through holes in the pixel definition layer appear to be tapered, and a dimension of the through hole gradually increases from one end away from the substrate to one end close to the substrate.

The benefits of the present invention are: in the OLED display device and the manufacture method thereof provided by the present invention, by respectively configuring the first PEDOT:PSS conductive film layer, the second PEDOT:PSS conductive film layer, the third PEDOT:PSS conductive film layer in the red OLED element, the green OLED element, the blue OLED element, and setting the first PEDOT:PSS conductive film layer, the second PEDOT:PSS conductive film layer, the third PEDOT:PSS conductive film layer to have various thicknesses to realize that the luminous efficiencies of the red OLED element, the green OLED element, the blue OLED element respectively achieve the best, and all the first PEDOT:PSS conductive film layer, the second PEDOT:PSS conductive film layer, the third PEDOT:PSS conductive film layer are manufactured by the ink jet printing method, and the production cost is low and the process is simple. In comparison with the traditional OLED display device, the thicknesses of the first hole transporting layer, the second hole transporting layer, the third hole transporting layer in the red OLED element, the green OLED element, the blue OLED element are the same in the OLED display device of the present invention, thus they can be formed in the same evaporation process with one common metal mask to eliminate three fine metal masks to lower the production cost and decrease the process time.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
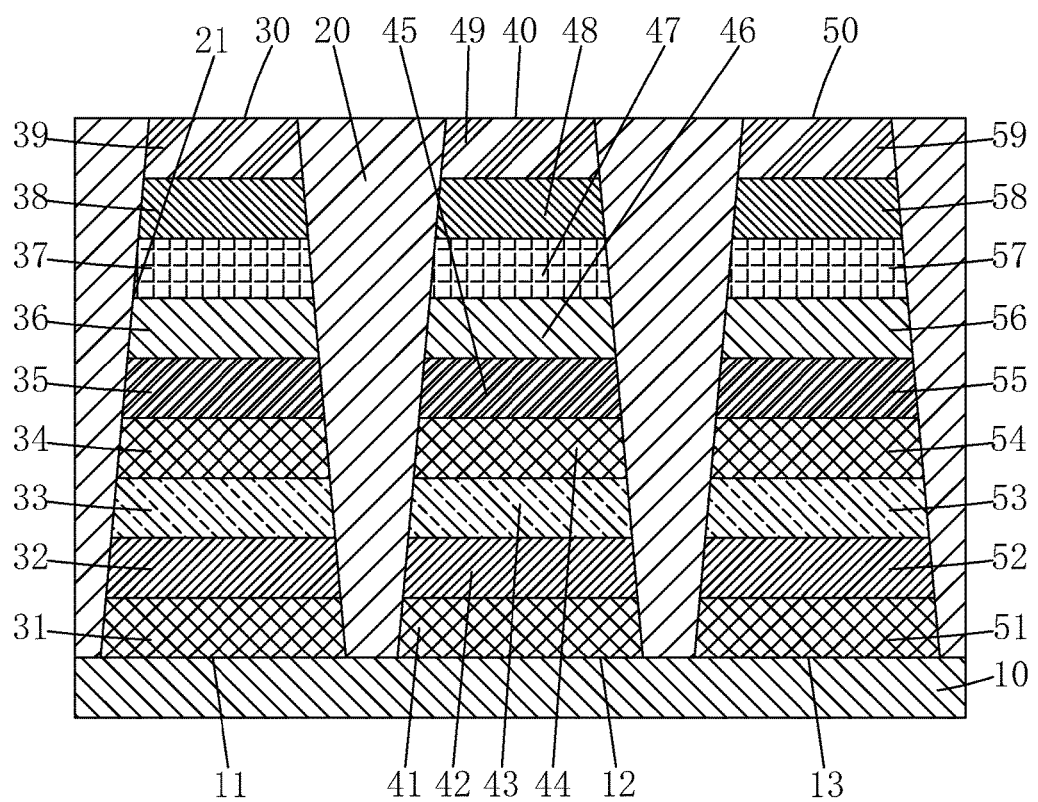
FIG. 1 is a structure diagram of an OLED display device of the present invention.

Please refer to FIG. 1. The present invention provides an OLED display device, comprising a substrate 10, a pixel definition layer 20 located on the substrate 10, a plurality of through holes 21 located in the pixel definition layer 20, and a plurality of red OLED elements 30, a plurality of green OLED elements 40 and a plurality of blue OLED elements 50, which are respectively located in the plurality of through holes 21;

the red OLED element 30 comprising a first transparent conductive metal oxide layer 31, a first metal layer 32, a first PEDOT:PSS conductive film layer 33, a second transparent conductive metal oxide layer 34, a first hole injection layer 35, a first hole transporting layer 36, a red light emitting layer 37, a first electron transporting layer 38 and a first cathode 39 on the substrate 10 from bottom to top in order; the first transparent conductive metal oxide layer 31, the first metal layer 32, the first PEDOT:PSS conductive film layer 33 and the second transparent conductive metal oxide layer 34 constituting a first anode 301, together;

the green OLED element 40 comprising a third transparent conductive metal oxide layer 41, a second metal layer 42, a second PEDOT:PSS conductive film layer 43, a fourth transparent conductive metal oxide layer 44, a second hole injection layer 45, a second hole transporting layer 46, a green light emitting layer 47, a second electron transporting layer 48 and a second cathode 49 on the substrate 10 from bottom to top in order; the third transparent conductive metal oxide layer 41, the second metal layer 42, the second PEDOT:PSS conductive film layer 43 and the fourth transparent conductive metal oxide layer 44 constituting a second anode 401, together;

the blue OLED element 50 comprising a fifth transparent conductive metal oxide layer 51, a third metal layer 52, a third PEDOT:PSS conductive film layer 53, a sixth transparent conductive metal oxide layer 54, a third hole injection layer 55, a third hole transporting layer 56, a blue light emitting layer 57, a third electron transporting layer 58 and a third cathode 59 on the substrate 10 from bottom to top in order; the fifth transparent conductive metal oxide layer 51, the third metal layer 52, the third PEDOT:PSS conductive film layer 53 and the sixth transparent conductive metal oxide layer 54 constituting a third anode 501, together.

Specifically, materials of the first PEDOT:PSS conductive film layer 33, the second PEDOT:PSS conductive film layer 43, the third PEDOT:PSS conductive film layer 53 are the same, and a refractive index thereof is $\eta_P$, and materials of the second transparent conductive metal oxide layer 34, the fourth transparent conductive metal oxide layer 44, the sixth transparent conductive metal oxide layer 54 are the same, and a refractive index thereof is $\eta_I$, and materials of the first hole injection layer 35, the second hole injection layer 45, the third hole injection layer 55 are the same, and a refractive index thereof is $\eta_J$, and materials of the first hole transporting layer 36, the second hole transporting layer 46, the third hole transporting layer 56 are the same, and a refractive index thereof is $\eta_T$, and a peak wavelength of red light emitted by the red light emitting layer 37 is $\lambda_R$, and a peak wavelength of green light emitted by the green light emitting layer 47 is $\lambda_G$, and a peak wavelength of blue light emitted by the blue light emitting layer 57 is $\lambda_B$;

a thickness of the first PEDOT:PSS conductive film layer 33 is defined to be $d_{RP}$, and a thickness of the second transparent conductive metal oxide layer 34 is defined to be $d_{RI}$, and a thickness of the first hole injection layer 35 is defined to be $d_{RJ}$, and a thickness of the first hole transporting layer 36 is defined to be $d_{RT}$, and a relation of $d_{RP}$, $d_{RI}$, $d_{RJ}$, $d_{RT}$ satisfies a relationship (1):

$$\eta_P{}^*d_{RP}+\eta_I{}^*d_{RI}+\eta_J{}^*d_{RJ}+\eta_T{}^*d_{RT}=(2m_R+1)\lambda_R/4 \tag{1}$$

wherein $m_R$ is a natural number;

a thickness of the second PEDOT:PSS conductive film layer 43 is defined to be $d_{GP}$, and a thickness of the fourth transparent conductive metal oxide layer 44 is defined to be $d_{GI}$, and a thickness of the second hole injection layer 45 is defined to be $d_{GJ}$, and a thickness of the second hole transporting layer 46 is defined to be $d_{GT}$, and a relation of $d_{GP}$, $d_{GI}$, $d_{GJ}$, $d_{GT}$ satisfies a relationship (2):

$$\eta_P{}^*d_{GP}+\eta_I{}^*d_{GI}+\eta_J{}^*d_{GJ}+\eta_T{}^*d_{GT}=(2m_G+1)\lambda_G/4 \tag{2}$$

wherein $m_G$ is a natural number;

a thickness of the third PEDOT:PSS conductive film layer 53 is defined to be $d_{BP}$, and a thickness of the sixth transparent conductive metal oxide layer 54 is defined to be $d_{BI}$, and a thickness of the third hole injection layer 55 is defined to be $d_{BJ}$, and a thickness of the third hole transporting layer 56 is defined to be $d_{BT}$, and a relation of $d_{BP}$, $d_{BI}$, $d_{BJ}$, $d_{BT}$ satisfies a relationship (3):

$$\eta_P{}^*d_{BP}+\eta_I{}^*d_{BI}+\eta_J{}^*d_{BJ}+\eta_T{}^*d_{BT}=(2m_B+1)\lambda_B/4 \tag{3}$$

wherein $m_B$ is a natural number;

and under the normal condition, $d_{RI}=d_{GI}=d_{BI}$, $d_{RJ}=d_{GJ}=d_{BJ}$, $d_{RT}=d_{GT}=d_{BT}$, $m_R=m_G=m_B$, and $\lambda_R$, $\lambda_G$, $\lambda_B$ are unequal, and thus, $d_{RP}$, $d_{GP}$, $d_{BP}$ are unequal.

Namely, the present invention adjusts the thicknesses of the first PEDOT:PSS conductive film layer 33, the second PEDOT:PSS conductive film layer 43, the third PEDOT:PSS conductive film layer 53 in the red OLED element 30, the green OLED element 40, the blue OLED element 50 to realize that the luminous efficiencies of the red OLED element 30, the green OLED element 40, the blue OLED element 50 respectively achieve the best, and all the first PEDOT:PSS conductive film layer 33, the second PEDOT:PSS conductive film layer 43, the third PEDOT:PSS conductive film layer 53 are manufactured by the ink jet printing method, and the production cost is low and the process is simple. In comparison with the traditional OLED display device, the thicknesses of the first hole transporting layer 36, the second hole transporting layer 46, the third hole transporting layer 56 in the red OLED element 30, the green OLED element 40, the blue OLED element 50 are the same in the OLED display device of the present invention, thus they can be formed in the same evaporation process with one CMM (Common Metal Mask) to eliminate three fine metal masks to lower the production cost and decrease the process time.

Specifically, in the OLED display device of the present invention, all the first anode 301, the second anode 302, the third anode 303 are reflection electrodes, and all the first cathode 39, the second cathode 49, the third cathode 59 are semi transparent electrodes. Then, all the red OLED element 30, the green OLED element 40, the blue OLED element 50 are top emitting OLED elements. The OLED element of the present invention is a top emitting OLED display device.

Specifically, the reasoning process of the foregoing relationships (1), (2), (3) is:

According to the Fabry-Perot resonance principle, for making the luminous efficiency of the top emitting OLED element achieve the best, the distance d from the light emitting layer to the reflection anode in the top emitting OLED element needs to satisfy the following relationship (4):

$$[\{(2m+1)/4\}-(1/8)]\lambda < \eta d < [\{(2m+1)/4\}+(1/8)]\lambda \quad (4);$$

wherein d represents the distance from the light emitting layer to the reflection anode, and η represents the refractive index of the material between the light emitting layer and the reflection anode, and λ represents the peak wavelength of the light emitted by the light emitting layer, and m represents the natural number.

Furthermore, preferably, the distance d satisfies the following relationship (5):

$$[\{(2m+1)/4\}-(1/16)]\lambda < \eta d < [\{(2m+1)/4\}+(1/16)]\lambda \quad (5);$$

Accordingly, it can be derived that as being the best preferred, the distance $d=(2m+1)\lambda/(4\eta)$.

Specifically, in the red/green/blue OLED elements 30/40/50 of the present invention, the distance d from the light emitting layer to the reflection anode is equal to a sum of thicknesses of the PEDOT:PSS conductive film layer, the transparent conductive metal oxide layer, the hole injection layer and the hole transporting layer on the metal layer.

Specifically, in the red OLED element 30, the distance from the red light emitting layer 37 to the first anode 301 $d_R=d_{RP}+d_{RI}+d_{RJ}+d_{RT}$, and thus, $\eta_P{*}d_{RP}+\eta_I{*}d_{RI}+\eta_J{*}d_{RJ}+\eta_T{*}d_{RT}=(2m_R+1)\lambda_R/4$.

Specifically, in the green OLED element 40, the distance from the green light emitting layer 47 to the second anode 401 $d_G=d_{BP}+d_{BI}+d_{BJ}+d_{BT}$, and thus, $\eta_P{*}d_{GP}+\eta_I{*}d_{GI}+\eta_J{*}d_{GJ}+\eta_T{*}d_{GT}=(2m_G+1)\lambda_G/4$.

Specifically, in the blue OLED element 50, the distance from the blue light emitting layer 57 to the third anode 501 $d_B=d_{BP}+d_{BI}+d_{BJ}+d_{BT}$, and thus, $\eta_P{*}d_{BP}+\eta_I{*}d_{BI}+\eta_J{*}d_{BJ}+\eta_T{*}d_{BT}=(2m_B+1)\lambda_B/4$.

Specifically, the substrate 10 is a transparent rigid substrate or a transparent flexible substrate. The transparent rigid substrate can be a glass substrate. The material of the flexible substrate comprises at least one of polyester compound and polyimide compound. In the embodiment of the present invention, the substrate 10 is a glass substrate.

Specifically, the plurality of through holes 21 in the pixel definition layer 20 appear to be tapered, and a dimension of the through hole 21 gradually increases from one end away from the substrate 10 to one end close to the substrate 10.

Specifically, material of the pixel definition layer 20 is an organic insulation material, and preferably is polyimide (PI).

Specifically, materials of the first transparent conductive metal oxide layer 31, the second transparent conductive metal oxide layer 34, the third transparent conductive metal oxide layer 41, the fourth transparent conductive metal oxide layer 44, the fifth transparent conductive metal oxide layer 51, the sixth transparent conductive metal oxide layer 54 are tin indium oxide.

Specifically, materials of the first metal layer 32, the second metal layer 42, the third metal layer 52 are silver.

Specifically, the refractive index of the PEDOT:PSS conductive film layer is 1.65, and possesses the advantages of high conductivity, high mechanical strength, high visible light transmission rate and excellent stability, and is water soluble polymer, which is easy to manufacture, to post process and to cure.

Specifically, materials of the first cathode 39, the second cathode 49, the third cathode 59 are the same, and comprise at least one of low work function metal, alloy formed by low work function metal and at least one of copper, gold, and silver, low work function metal nitride and low work function metal fluoride; the low work function metal comprises at least one of lithium, magnesium, calcium, strontium, aluminum and indium.

Preferably, the first cathode 39, the second cathode 49, the third cathode 59 are magnesium silver alloy layers, composite layers composed of stacking up magnesium silver alloy layers and silver layers, composite layers composed of stacking up lithium fluoride layer or lithium nitride layer and silver layers, or composite layers composed of stacking up lithium fluoride layer or lithium nitride layer and aluminum layers. In the embodiment of the present invention, the first cathode 39, the second cathode 49, the third cathode 59 are magnesium silver alloy layers.

Specifically, materials of the first hole injection layer 35, the second hole injection layer 45, the third hole injection layer 55 comprise HAT(CN)$_6$, and a constitutional formula of HAT(CN)$_6$ is

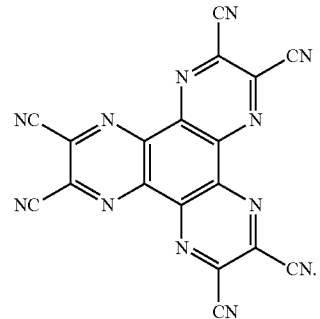 [SMILES: N#Cc1nc2c3nc(C#N)c(C#N)nc3c3nc(C#N)c(C#N)nc3c2nc1C#N]

Specifically, materials of the first hole transporting layer 36, the second hole transporting layer 46, the third hole transporting layer 56 comprise HTM081 of the merck company.

Specifically, the red light emitting layer 37 comprises a main material and a doped dye, and the main material is CBP, and the doped dye is red phosphorescent dye, and preferably, the red phosphorescent dye is Ir(DBQ)$_2$(acac). Specifically, in the red light emitting layer 37, a concentration of the doped dye is 3 wt %-5 wt %.

Specifically, the green light emitting layer 47 comprises a main material and a doped dye, and the main material is CBP, and the doped dye is green phosphorescent dye, and preferably, the green phosphorescent dye is Ir(ppy)$_3$. Specifically, in the green light emitting layer 47, a concentration of the doped dye is 3 wt %-15 wt %, and preferably is 3 wt %-10 wt %, and more preferably is 5 wt %-10 wt %.

Specifically, the blue light emitting layer 57 comprises a main material and a doped dye, and the main material is AND, and the doped dye is blue fluorescent dye, and preferably, the blue fluorescent dye is BUBD-1. Specifically, in the blue light emitting layer 57, a concentration of the doped dye is 3 wt %-5 wt %.

Specifically, a constitutional formula of CBP is

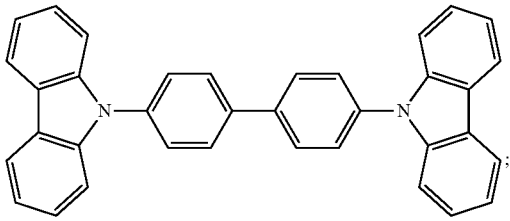 [SMILES: c1ccc2c(c1)c1ccccc1n2-c1ccc(-c2ccc(-n3c4ccccc4c4ccccc43)cc2)cc1]

a constitutional formula of Ir(DBQ)₂(acac) is

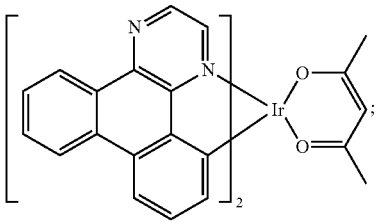

a constitutional formula of Ir(ppy)₃ is

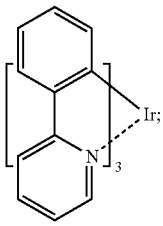

a constitutional formula of BUBD-1 is

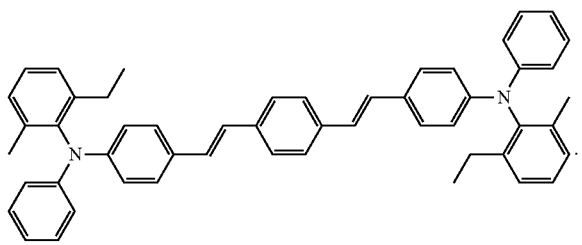 [SMILES: CCc1cccc(C)c1N(c1ccccc1)c1ccc(/C=C/c2ccc(/C=C/c3ccc(N(c4ccccc4)c4c(C)cccc4CC)cc3)cc2)cc1]

Specifically, a peak wavelength of red light emitted by the red light emitting layer 37 is 612 nm, and a peak wavelength of green light emitted by the green light emitting layer 47 is 512 nm, and a peak wavelength of blue light emitted by the blue light emitting layer 57 is 468 nm.

Specifically, materials of the first electron transporting layer 38, the second electron transporting layer 48, the third electron transporting layer 58 are the same, and comprise BPhen, and a constitutional formula of BPhen is

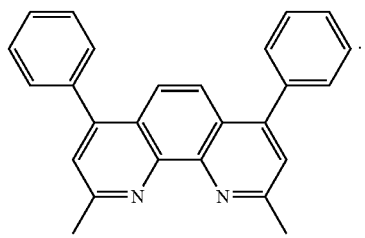 [SMILES: Cc1cc(-c2ccccc2)c2ccc3c(-c4ccccc4)cc(C)nc3c2n1]

Specifically, thicknesses of the first transparent conductive metal oxide layer 31, the second transparent conductive metal oxide layer 34, the third transparent conductive metal oxide layer 41, the fourth transparent conductive metal oxide layer 44, the fifth transparent conductive metal oxide layer 51, the sixth transparent conductive metal oxide layer 54 are 10 nm-200 nm, and preferably are 10 nm-100 nm, and more preferably are 10 nm-50 nm.

Specifically, thicknesses of the first metal layer 32, the second metal layer 42, the third metal layer 52 are 80 nm-300 nm, and preferably are 80 nm-200 nm, and more preferably are 100 nm-150 nm.

Specifically, thicknesses of the first hole injection layer 35, the second hole injection layer 45, the third hole injection layer 55 are 5 nm-30 nm, and preferably are 5 nm-20 nm, and more preferably are 5 nm-10 nm.

Specifically, thicknesses of the first hole transporting layer 36, the second hole transporting layer 46, the third hole transporting layer 56 are 20 nm-400 nm, and preferably are 50 nm-300 nm, and more preferably are 50 nm-200 nm.

Specifically, a thickness of the red light emitting layer 37 is 10 nm-30 nm, and preferably is 15 nm-25 nm, and more preferably is 20 nm-25 nm.

Specifically, a thickness of the green light emitting layer 47 is 10 nm-50 nm, and preferably is 20 nm-40 nm, and more preferably is 30 nm-40 nm.

Specifically, a thickness of the blue light emitting layer 57 is 10 nm-50 nm, and preferably is 20 nm-40 nm, and more preferably is 30 nm-40 nm.

Specifically, thicknesses of the first electron transporting layer 38, the second electron transporting layer 48, the third electron transporting layer 58 are 5 nm-50 nm, and preferably are 20 nm-40 nm, and more preferably are 25 nm-35 nm.

In the aforesaid OLED display device, by respectively configuring the first PEDOT:PSS conductive film layer 33, the second PEDOT:PSS conductive film layer 43, the third PEDOT:PSS conductive film layer 53 in the red OLED element 30, the green OLED element 40, the blue OLED element 50, and setting the first PEDOT:PSS conductive film layer 33, the second PEDOT:PSS conductive film layer 43, the third PEDOT:PSS conductive film layer 53 to have various thicknesses to realize that the luminous efficiencies of the red OLED element 30, the green OLED element 40, the blue OLED element 50 respectively achieve the best, and all the first PEDOT:PSS conductive film layer 33, the second PEDOT:PSS conductive film layer 43, the third PEDOT:PSS conductive film layer 53 are manufactured by the ink jet printing method, and the production cost is low and the process is simple. In comparison with the traditional OLED display device, the thicknesses of the first hole transporting layer 36, the second hole transporting layer 46, the third hole transporting layer 56 in the red OLED element 30, the green OLED element 40, the blue OLED element 50 are the same in the OLED display device of the present invention, thus they can be formed in the same evaporation process with one common metal mask (CMM) to eliminate three fine metal masks to lower the production cost and decrease the process time.

Figure 2:
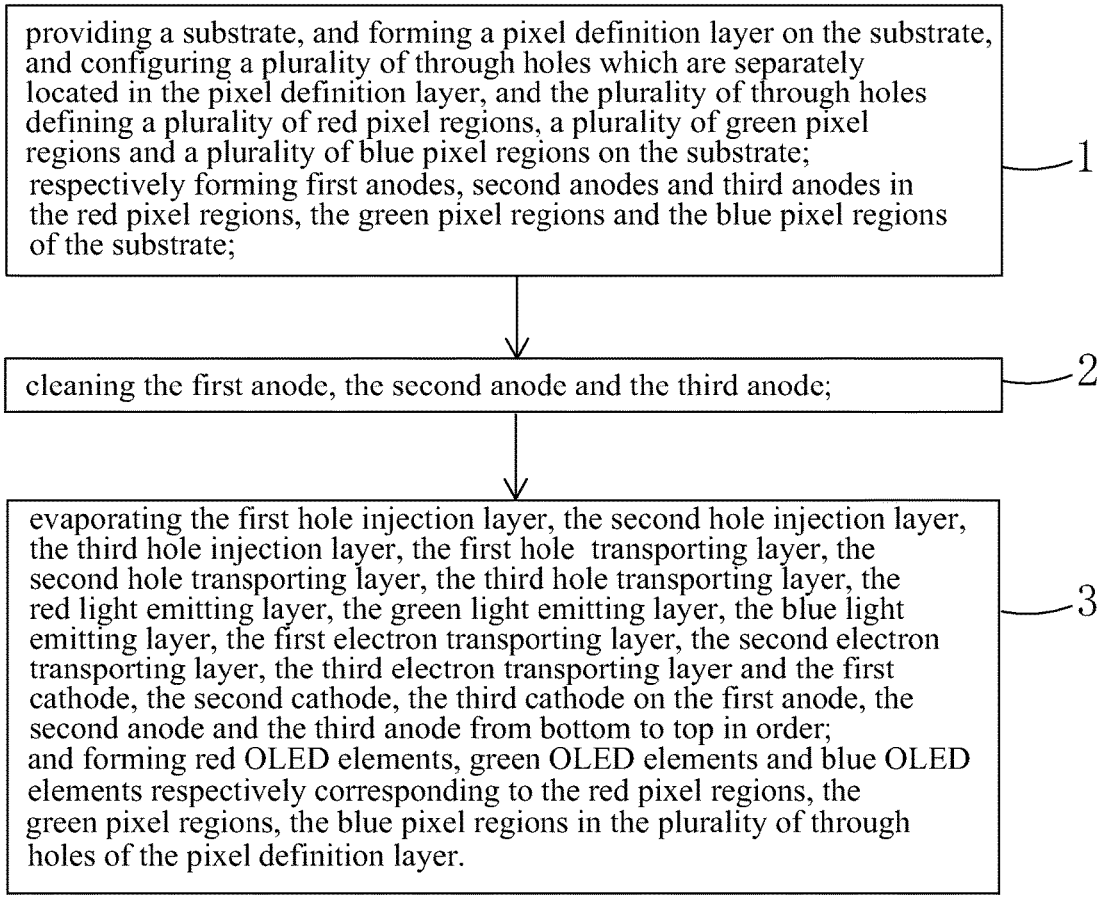
FIG. 2 is a flowchart of a manufacture method of an OLED display device of the present invention.

Please refer to FIG. 2 with FIG. 1, together. The present invention further provides a manufacture method of an OLED display device, comprising steps of:

step 1, providing a substrate 10, and forming a pixel definition layer 20 on the substrate 10, and configuring a plurality of through holes 21 which are separately located in the definition layer 20, and the plurality of through holes 21 defining a plurality of red pixel regions 11, a plurality of green pixel regions 12 and a plurality of blue pixel regions 13 on the substrate 10;

respectively forming a first transparent conductive metal oxide layer 31, a third transparent conductive metal oxide layer 41, a fifth transparent conductive metal oxide layer 51 in the red pixel region 11, the green pixel region 12 and the blue pixel region 13 of the substrate 10;

respectively forming a first metal layer 32, a second metal layer 42, a third metal layer 52 on the first transparent conductive metal oxide layer 31, the third transparent conductive metal oxide layer 41, the fifth transparent conductive metal oxide layer 51;

respectively coating PEDOT:PSS aqueous solution on the first metal layer 32, the second metal layer 42, the third metal layer 52, and forming a first PEDOT:PSS conductive film layer 33, a second PEDOT:PSS conductive film layer 43, a third PEDOT:PSS conductive film layer 53 after curing and removing moisture;

respectively depositing a second transparent conductive metal oxide layer 34, a fourth transparent conductive metal oxide layer 44, a sixth transparent conductive metal oxide layer 54 on the first PEDOT:PSS conductive film layer 33, the second PEDOT:PSS conductive film layer 43, the third PEDOT:PSS conductive film layer 53;

in the red pixel region 11, the first transparent conductive metal oxide layer 31, the first metal layer 32, the first PEDOT:PSS conductive film layer 33 and the second transparent conductive metal oxide layer 34 which are stacked up from bottom to top in order constituting a first anode 301, together;

in the green pixel region 12, the third transparent conductive metal oxide layer 41, the second metal layer 42, the second PEDOT:PSS conductive film layer 43 and the fourth transparent conductive metal oxide layer 44 which are stacked up from bottom to top in order constituting a second anode 401, together;

in the blue pixel region 13, the fifth transparent conductive metal oxide layer 51, the third metal layer 52, the third PEDOT:PSS conductive film layer 53 and the sixth transparent conductive metal oxide layer 54 which are stacked up from bottom to top in order constituting a third anode 501, together;

Specifically, the plurality of through holes 21 in the pixel definition layer 20 appear to be tapered, and a dimension of the through hole 21 gradually increases from one end away from the substrate 10 to one end close to the substrate 10.

Specifically, in step 1, a magnetron sputtering method is used to deposit the first transparent conductive metal oxide layer 31, the second transparent conductive metal oxide layer 34, the third transparent conductive metal oxide layer 41, the fourth transparent conductive metal oxide layer 44, the fifth transparent conductive metal oxide layer 51, the sixth transparent conductive metal oxide layer 54 in the $1\times10^{-5}$ Pa vacuum, and the deposition rate is 60 nm/m in.

Specifically, in step 1, an ink jet printing method is used to respectively coat PEDOT:PSS aqueous solution on the first metal layer 32, the second metal layer 42 and the third metal layer 52.

Specifically, in step 1, a magnetron sputtering method is used to deposit the first metal layer 32, the second metal layer 42 and the third metal layer 52 in the $1\times10^{-5}$ Pa vacuum, and the deposition rate is 2400 nm/m in.

Because the plurality of through holes 21 in the pixel definition layer 20 appear to be tapered, and a dimension of the through hole 21 gradually increases from one end away from the substrate 10 to one end close to the substrate 10. Thus, it can be ensured that as a magnetron sputtering method is used to deposit the first transparent conductive metal oxide layer 31, the second transparent conductive metal oxide layer 34, the third transparent conductive metal oxide layer 41, the fourth transparent conductive metal oxide layer 44, the fifth transparent conductive metal oxide layer 51, the sixth transparent conductive metal oxide layer 54, and the first metal layer 32, the second metal layer 42, the third metal layer 52, the hole walls of the plurality of through holes 21 will not be sputtered with the target material to prevent that the corresponding structure layers in the plurality of through holes 21 are connected via the hole walls of the through holes 21 and the top surface of the pixel definition layer 20.

Specifically, in step 1, the ink jet printing apparatus of Kateeva company is used to coat PEDOT:PSS aqueous solution, and after coating the PEDOT:PSS aqueous solution is accomplished, and after 3 minutes leveling, a 256 nm ultraviolet light is used for curing and removing moisture to form the first PEDOT:PSS conductive film layer 33, the second PEDOT:PSS conductive film layer 43, the third PEDOT:PSS conductive film layer 53.

step 2, cleaning the first anode 301, the second anode 401 and the third anode 501.

Specifically, in step 2, first, the substrate 10 carrying the first anode 301, the second anode 401 and the third anode 501 is treated with ultrasonic process in commercial cleaning agent (such as detergent) to be washed in deionized water, and to be ultrasonic degreased in a mixture solvent of acetone/ethanol (volume ratio 1/1), and baked in a clean environment until the water is completely removed. Then, it is cleaned with ultraviolet light and ozone, and is bombarded at the surface with low energy ion beam (plasma, such as argon, nitrogen) to obtain the first anode 301, the second anode 401 and the third anode 501 which are clean.

step 3, respectively evaporating a first hole injection layer 35, a second hole injection layer 45, a third hole injection layer 55 on the first anode 301, the second anode 401 and the third anode 501 in the same evaporation process;

respectively evaporating a first hole transporting layer 36, a second hole transporting layer 46, a third hole transporting layer 56 on the first hole injection layer 35, the second hole injection layer 45, the third hole injection layer 55 in the same evaporation process;

respectively evaporating a red light emitting layer 37, a green light emitting layer 47, a blue light emitting layer 57 on the first hole transporting layer 36, the second hole transporting layer 46, the third hole transporting layer 56 in three different evaporation processes;

respectively evaporating a first electron transporting layer 38, a second electron transporting layer 48, a third electron transporting layer 58 on the red light emitting layer 37, the green light emitting layer 47, the blue light emitting layer 57 in the same evaporation process;

respectively evaporating a first cathode 39, a second cathode 49, a third cathode 59 on the first electron transporting layer 38, the second electron transporting layer 48, the third electron transporting layer 58 in the same evaporation process;

and forming red OLED elements 30, green OLED elements 40 and blue OLED elements 50 respectively corresponding to the red pixel regions 11, the green pixel regions 12, the blue pixel regions 13 in the plurality of through holes 21 of the pixel definition layer 20.

Specifically, materials of the first PEDOT:PSS conductive film layer 33, the second PEDOT:PSS conductive film layer 43, the third PEDOT:PSS conductive film layer 53 are the same, and a refractive index thereof is $\eta_P$, and materials of the second transparent conductive metal oxide layer 34, the fourth transparent conductive metal oxide layer 44, the sixth transparent conductive metal oxide layer 54 are the same, and a refractive index thereof is $\eta_I$, and materials of the first hole injection layer 35, the second hole injection layer 45, the third hole injection layer 55 are the same, and a refractive index thereof is $\eta_J$, and materials of the first hole transporting layer 36, the second hole transporting layer 46, the third hole transporting layer 56 are the same, and a refractive index thereof is $\eta_T$, and a peak wavelength of red light emitted by the red light emitting layer 37 is $\lambda_R$, and a peak wavelength of green light emitted by the green light emitting layer 47 is $\lambda_G$, and a peak wavelength of blue light emitted by the blue light emitting layer 57 is $\lambda_B$;

a thickness of the first PEDOT:PSS conductive film layer 33 is defined to be $d_{RP}$, and a thickness of the second transparent conductive metal oxide layer 34 is defined to be $d_{RI}$, and a thickness of the first hole injection layer 35 is defined to be $d_{RJ}$, and a thickness of the first hole transporting layer 36 is defined to be $d_{RT}$, and a relation of $d_{RP}$, $d_{RI}$, $d_{RJ}$, $d_{RT}$ satisfies a relationship (1):

$$\eta_P*d_{RP}+\eta_I*d_{RI}+\eta_J*d_{RJ}+\eta_T*d_{RT}=(2m_R+1)\lambda_R/4 \quad (1);$$

wherein $m_R$ is a natural number;

a thickness of the second PEDOT:PSS conductive film layer 43 is defined to be $d_{GP}$, and a thickness of the fourth transparent conductive metal oxide layer 44 is defined to be $d_{GI}$, and a thickness of the second hole injection layer 45 is defined to be $d_{GJ}$, and a thickness of the second hole transporting layer 46 is defined to be $d_{GT}$, and a relation of $d_{GP}$, $d_{GI}$, $d_{GJ}$, $d_{GT}$ satisfies a relationship (2):

$$\eta_P*d_{GP}+\eta_I*d_{GI}+\eta_J*d_{GJ}+\eta_T*d_{GT}=(2m_G+1)\lambda_G/4 \quad (2);$$

wherein $m_G$ is a natural number;

a thickness of the third PEDOT:PSS conductive film layer 53 is defined to be $d_{BP}$, and a thickness of the sixth transparent conductive metal oxide layer 54 is defined to be $d_{BI}$, and a thickness of the third hole injection layer 55 is defined to be $d_{BJ}$, and a thickness of the third hole transporting layer 56 is defined to be $d_{BT}$, and a relation of $d_{BP}$, $d_{BI}$, $d_{BJ}$, $d_{BT}$ satisfies a relationship (3):

$$\eta_P*d_{BP}+\eta_I*d_{BI}+\eta_J*d_{BJ}+\eta_T*d_{BT}=(2m_B+1)\lambda_B/4 \quad (3);$$

wherein $m_B$ is a natural number;

and under the normal condition, $d_{RI}=d_{GI}=d_{BI}$, $d_{RJ}=d_{GJ}=d_{BJ}$, $d_{RT}=d_{GT}=d_{BT}$, $m_R=m_G=m_B$, and $\lambda_R$, $\lambda_G$, $\lambda_B$ are unequal, and thus, $d_{RP}$, $d_{GP}$, $d_{BP}$ are unequal.

Specifically, in step 3, the first hole injection layer 35, the second hole injection layer 45, the third hole injection layer 55 are manufactured by one evaporation process with one common metal mask (CMM);

the first hole transporting layer 36, the second hole transporting layer 46, the third hole transporting layer 56 are manufactured by one evaporation process with one common metal mask (CMM);

the red light emitting layer 37, the green light emitting layer 47, the blue light emitting layer 57 are manufactured by three different evaporation processes with three different fine metal mask (FMM);

the first electron transporting layer 38, the second electron transporting layer 48, the third electron transporting layer 58 are manufactured by one evaporation process with one common metal mask (CMM);

the first cathode 39, the second cathode 49, the third cathode 59 are manufactured by one evaporation process with one common metal mask (CMM).

Specifically, the common metal mask (CMM) is merely a metal mask having openings, and openings correspond to the all the red pixel regions 11, the green regions 12, the blue regions 13 which require evaporation and the pixel definition layers 20 among all the red pixel regions 11, the green regions 12, the blue regions 13 on the substrate 10.

Because the plurality of through holes 21 in the pixel definition layer 20 appear to be tapered, and a dimension of the through hole 21 gradually increases from one end away from the substrate 10 to one end close to the substrate 10. Thus, it can be ensured that as the common metal mask (CMM) is used to evaporate the first hole injection layer 35, the second hole injection layer 45, the third hole injection layer 55, the first hole transporting layer 36, the second hole transporting layer 46, the third hole transporting layer 56, the first electron transporting layer 38, the second electron transporting layer 48, the third electron transporting layer 58, and the first cathode 39, the second cathode 49, the third cathode 59, the hole walls of the plurality of through holes 21 will not be evaporated with the target material to prevent that the corresponding structure layers in the plurality of through holes 21 are connected via the hole walls of the through holes 21 and the top surface of the pixel definition layer 20.

Specifically, in step 3, all evaporation processes are conducted in a vacuum chamber of $1\times10^{-6}$ to $2\times10^{-4}$ Pa vacuum.

Specifically, the evaporation rate of the first hole injection layer 35, the second hole injection layer 45, the third hole injection layer 55 is 0.05 nm/s.

Specifically, the evaporation rate of the first hole transporting layer 36, the second hole transporting layer 46, the third hole transporting layer 56 is 0.1 nm/s.

Specifically, the red light emitting layer 37 is formed by the evaporation method of main material and doped dye dual sources co evaporation, wherein the evaporation rate of main material is 0.1 nm/s, and the evaporation rate of doped dye is 0.003 nm/s.

Specifically, the green light emitting layer 47 is formed by the evaporation method of main material and doped dye dual sources co evaporation, wherein the evaporation rate of main material is 0.1 nm/s, and the evaporation rate of doped dye is 0.01 nm/s.

Specifically, the blue light emitting layer 57 is formed by the evaporation method of main material and doped dye dual sources co evaporation, wherein the evaporation rate of main material is 0.1 nm/s, and the evaporation rate of doped dye is 0.005 nm/s.

Specifically, the evaporation rate of the first electron transporting layer 38, the second electron transporting layer 48, the third electron transporting layer 58 is 0.1 nm/s.

Specifically, in the aforesaid manufacture method of the OLED display device, the selections of the specific materials and thickness ranges of the respective structure layers are described aforementioned, and the repeated description is omitted here.

Specifically, as the first cathode 39, the second cathode 49, the third cathode 59 are magnesium silver alloy layers, the manufacture method of the first cathode 39, the second cathode 49, the third cathode 59 is: formed by the evaporation method of magnesium and silver dual sources co evaporation, wherein the evaporation rate of magnesium is 0.09 nm/s, and the evaporation rate of silver is 0.01 nm/s.

In the aforesaid manufacture method of the OLED display device, by respectively configuring the first PEDOT:PSS conductive film layer 33, the second PEDOT:PSS conductive film layer 43, the third PEDOT:PSS conductive film layer 53 in the red OLED element 30, the green OLED element 40, the blue OLED element 50, and setting the first PEDOT:PSS conductive film layer 33, the second PEDOT:PSS conductive film layer 43, the third PEDOT:PSS conductive film layer 53 to have various thicknesses to realize that the luminous efficiencies of the red OLED element 30, the green OLED element 40, the blue OLED element 50 respectively achieve the best, and all the first PEDOT:PSS conductive film layer 33, the second PEDOT:PSS conductive film layer 43, the third PEDOT:PSS conductive film layer 53 are manufactured by the ink jet printing method, and the production cost is low and the process is simple. In comparison with the traditional OLED display device, the thicknesses of the first hole transporting layer 36, the second hole transporting layer 46, the third hole transporting layer 56 in the red OLED element 30, the green OLED element 40, the blue OLED element 50 are the same in the OLED display device of the present invention, thus they can be formed in the same evaporation process with one common metal mask (CMM) to eliminate three fine metal masks to lower the production cost and decrease the process time.

With the comparison for the embodiment 1 of the present invention and the comparison 1 according to prior art, the advantages of the OLED display device and manufacture method thereof of the present invention are analyzed:

Embodiment 1

In the OLED display device of embodiment 1:

the red OLED element comprising a first transparent conductive metal oxide layer 31, a first metal layer 32, a first PEDOT:PSS conductive film layer 33, a second transparent conductive metal oxide layer 34, a first hole injection layer 35, a first hole transporting layer 36, a red light emitting layer 37, a first electron transporting layer 38 and a first cathode 39 on the substrate 10 from bottom to top in order;

a thickness of the first transparent conductive metal oxide layer 31 is 20 nm; a thickness of the first metal layer 32 is 150 nm; a thickness of the first PEDOT:PSS conductive film layer 33 is $X_R$ nm; a thickness of the second transparent conductive metal oxide layer 34 is 20 nm; a material of the first hole injection layer 35 is $HAT(CN)_6$ and a thickness is 5 nm; a material of the first hole transporting layer 36 is HTM081 and a thickness is 20 nm; the red light emitting layer 37 comprises a main material CBP and red phosphorescent dye $Ir(DBQ)_2(acac)$, and a concentration of the red phosphorescent dye $Ir(DBQ)_2(acac)$ is 3 wt %, and a thickness of the red light emitting layer 37 is 30 nm; a material of the first electron transporting layer 38 is Bphen, and a thickness is 20 nm; the first cathode 39 is a magnesium silver alloy layer, and mass ratio of the magnesium and silver in the magnesium silver alloy layer is 9:1, and a thickness of the first cathode 39 is 20 nm;

the green OLED element 40 comprising a third transparent conductive metal oxide layer 41, a second metal layer 42, a second PEDOT:PSS conductive film layer 43, a fourth transparent conductive metal oxide layer 44, a second hole injection layer 45, a second hole transporting layer 46, a green light emitting layer 47, a second electron transporting layer 48 and a second cathode 49 on the substrate 10 from bottom to top in order;

a thickness of the second transparent conductive metal oxide layer 41 is 20 nm; a thickness of the second metal layer 42 is 150 nm; a thickness of the second PEDOT:PSS conductive film layer 43 is $X_G$ nm; a thickness of the fourth transparent conductive metal oxide layer 44 is 20 nm; a material of the second hole injection layer 45 is $HAT(CN)_6$ and a thickness is 5 nm; a material of the second hole transporting layer 46 is HTM081 and a thickness is 20 nm; the green light emitting layer 47 comprises a main material CBP and green phosphorescent dye $Ir(ppy)_3$, and a concentration of the green phosphorescent dye $Ir(ppy)_3$ is 10 wt %, and a thickness of the green light emitting layer 47 is 30 nm; a material of the second electron transporting layer 48 is Bphen, and a thickness is 20 nm; the second cathode 49 is a magnesium silver alloy layer, and a mass ratio of the magnesium and silver in the magnesium silver alloy layer is 9:1, and a thickness of the second cathode 49 is 20 nm;

the blue OLED element 50 comprising a fifth transparent conductive metal oxide layer 51, a third metal layer 52, a third PEDOT:PSS conductive film layer 53, a sixth transparent conductive metal oxide layer 54, a third hole injection layer 55, a third hole transporting layer 56, a blue light emitting layer 57, a third electron transporting layer 58 and a third cathode 59 on the substrate 10 from bottom to top in order;

a thickness of the fifth transparent conductive metal oxide layer 51 is 20 nm; a thickness of the third metal layer 52 is 150 nm; a thickness of the third PEDOT:PSS conductive film layer 53 is $X_B$ nm; a thickness of the sixth transparent conductive metal oxide layer 54 is 20 nm; a material of the third hole injection layer 55 is $HAT(CN)_6$ and a thickness is 5 nm; a material of the third hole transporting layer 56 is HTM081 and a thickness is 20 nm; the blue light emitting layer 57 comprises a main material CBP and blue fluorescent dye BUBD-1, and a concentration of the blue fluorescent dye BUBD-1 is 5 wt %, and a thickness of the blue light emitting layer 57 is 20 nm; a material of the third electron transporting layer 58 is Bphen, and a thickness is 20 nm; the third cathode 59 is a magnesium silver alloy layer, and a mass ratio of the magnesium and silver in the magnesium silver alloy layer is 9:1, and a thickness of the third cathode 59 is 20 nm;

For making the red light emitting layer 37, the green light emitting layer 47, the blue light emitting layer 57 respectively at the positions of antinodes to make that the luminous efficiencies of the red OLED element 30, the green OLED element 40, the blue OLED element 50 respectively achieve the best, in condition of $m_R=m_G=m_B=3$, the thicknesses of the first PEDOT:PSS conductive film layer 33, the second PEDOT:PSS conductive film layer 43, the third PEDOT:PSS conductive film layer 53 are respectively calculated: $X_R=229$ nm, $X_G=183$ nm, $X_B=158$ nm according to the aforesaid relationships (1), (2), (3).

Comparison 1

In the OLED display device of comparison 1:

the red OLED element comprising a first transparent conductive metal oxide layer 31, a first metal layer 32, a second transparent conductive metal oxide layer 34, a first hole injection layer 35, a first hole transporting layer 36, a red light emitting layer 37, a first electron transporting layer 38 and a first cathode 39 on the substrate 10 from bottom to top in order;

a thickness of the first transparent conductive metal oxide layer 31 is 20 nm; a thickness of the first metal layer 32 is 150 nm; a thickness of the second transparent conductive metal oxide layer 34 is 20 nm; a material of the first hole injection layer 35 is HAT(CN)$_6$ and a thickness is 5 nm; a material of the first hole transporting layer 36 is HTM081 and a thickness is $X_1$ nm; the red light emitting layer 37 comprises a main material CBP and red phosphorescent dye Ir(DBQ)$_2$(acac), and a concentration of the red phosphorescent dye Ir(DBQ)$_2$(acac) is 3 wt %, and a thickness of the red light emitting layer 37 is 30 nm; a material of the first electron transporting layer 38 is Bphen, and a thickness is 20 nm; the first cathode 39 is a magnesium silver alloy layer, and a mass ratio of the magnesium and silver in the magnesium silver alloy layer is 9:1, and a thickness of the first cathode 39 is 20 nm;

the green OLED element 40 comprising a third transparent conductive metal oxide layer 41, a second metal layer 42, a fourth transparent conductive metal oxide layer 44, a second hole injection layer 45, a second hole transporting layer 46, a green light emitting layer 47, a second electron transporting layer 48 and a second cathode 49 on the substrate 10 from bottom to top in order;

a thickness of the third transparent conductive metal oxide layer 41 is 20 nm; a thickness of the second metal layer 42 is 150 nm; a thickness of the fourth transparent conductive metal oxide layer 44 is 20 nm; a material of the second hole injection layer 45 is HAT(CN)$_6$ and a thickness is 5 nm; a material of the second hole transporting layer 46 is HTM081 and a thickness is $X_2$ nm; the green light emitting layer 47 comprises a main material CBP and green phosphorescent dye Ir(ppy)$_3$, and a concentration of the green phosphorescent dye Ir(ppy)$_3$ is 10 wt %, and a thickness of the green light emitting layer 47 is 30 nm; a material of the second electron transporting layer 48 is Bphen, and a thickness is 20 nm; the second cathode 49 is a magnesium silver alloy layer, and a mass ratio of the magnesium and silver in the magnesium silver alloy layer is 9:1, and a thickness of the second cathode 49 is 20 nm;

the blue OLED element 50 comprising a fifth transparent conductive metal oxide layer 51, a third metal layer 52, a sixth transparent conductive metal oxide layer 54, a third hole injection layer 55, a third hole transporting layer 56, a blue light emitting layer 57, a third electron transporting layer 58 and a third cathode 59 on the substrate 10 from bottom to top in order;

a thickness of the fifth transparent conductive metal oxide layer 51 is 20 nm; a thickness of the third metal layer 52 is 150 nm; a thickness of the sixth transparent conductive metal oxide layer 54 is 20 nm; a material of the third hole injection layer 55 is HAT(CN)$_6$ and a thickness is 5 nm; a material of the third hole transporting layer 56 is HTM081 and a thickness is $X_3$ nm; the blue light emitting layer 57 comprises a main material CBP and blue fluorescent dye BUBD-1, and a concentration of the blue fluorescent dye BUBD-1 is 5 wt %, and a thickness of the blue light emitting layer 57 is 20 nm; a material of the third electron transporting layer 58 is Bphen, and a thickness is 20 nm; the third cathode 59 is a magnesium silver alloy layer, and a mass ratio of the magnesium and silver in the magnesium silver alloy layer is 9:1, and a thickness of the third cathode 59 is 20 nm;

It can be told that the difference of comparison 1 and embodiment 1 is: there are no first PEDOT:PSS conductive film layer 33, no second PEDOT:PSS conductive film layer 43, no third PEDOT:PSS conductive film layer 53 configured in the red OLED element 30, the green OLED element 40, the blue OLED element 50, and the thicknesses of the first hole transporting layer 36, the second hole transporting layer 46, the third hole transporting layer 56 are different.

For making the red light emitting layer 37, the green light emitting layer 47, the blue light emitting layer 57 respectively at the positions of antinodes to make that the luminous efficiencies of the red OLED element 30, the green OLED element 40, the blue OLED element 50 respectively achieve the best, the thicknesses of the first hole transporting layer 36, the second hole transporting layer 46, the third hole transporting layer 56 are respectively set to be: $X_1$=236 nm, $X_2$=193 nm, $X_3$=169 nm.

Under the same voltage driving, and for showing the same image, the image brightness and the chroma data of the OLED display devices of embodiment 1 and comparison 1 are shown in Table 1 and Table 2:

TABLE 1 image brightness and chroma data of the OLED display device of embodiment 1

| Embodiment 1 | brightness d/m$^2$ | chroma CIE-X | chroma CIE-Y |
| --- | --- | --- | --- |
| W image | 165 | 0.300 | 0.313 |
| R image | 59 | 0.660 | 0.330 |
| G image | 158 | 0.237 | 0.711 |
| B image | 13 | 0.144 | 0.044 |

TABLE 2 image brightness and chroma data of the OLED display device of comparison 1

| Comparison 1 | brightness cd/m$^2$ | chroma CIE-X | chroma CIE-Y |
| --- | --- | --- | --- |
| W image | 160 | 0.300 | 0.313 |
| R image | 57 | 0.671 | 0.329 |
| G image | 156 | 0.236 | 0.705 |
| B image | 12 | 0.144 | 0.044 |

As shown in Table 1 and Table 2, the display properties of the OLED display devices of the embodiment 1 and the comparison 1 are basically the same, however:

in the embodiment 1, by respectively setting the first PEDOT:PSS conductive film layer 33, the second PEDOT:PSS conductive film layer 43, the third PEDOT:PSS conductive film layer 53 to have various thicknesses to realize that the luminous efficiencies of the red OLED element 30, the green OLED element 40, the blue OLED element 50 respectively achieve the best, and all the first PEDOT:PSS conductive film layer 33, the second PEDOT:PSS conductive film layer 43, the third PEDOT:PSS conductive film layer 53 are manufactured by the ink jet printing method, and the production cost is low and the process is simple. The thicknesses of the first hole transporting layer 36, the second hole transporting layer 46, the third hole transporting layer 56 are the same, and thus they can be formed in the same evaporation process with one common metal mask (CMM) to eliminate three fine metal masks to lower the production cost and decrease the process time;

In the comparison 1, by setting the first hole transporting layer 36, the second hole transporting layer 46, the third hole transporting layer 56 to have various thicknesses to realize that the luminous efficiencies of the red OLED element 30, the green OLED element 40, the blue OLED element 50 respectively achieve the best, the thicknesses of the first hole transporting layer 36, the second hole transporting layer 46, the third hole transporting layer 56 are different, and therefore, the first hole transporting layer 36, the second hole transporting layer 46, the third hole transporting layer 56 require to use three fine metal masks (FMM) and three evaporation processes for manufacture, and the production cost is high and the manufacture process is long;

therefore, in comparison with comparison 1, the advantage of the embodiment 1 of the present invention is eliminating the use of the three fine metal masks to simplify the OLED evaporation process, and to tremendously raise the product yield while saving the cost.

In conclusion, the present invention provides an OLED display device and a manufacture method thereof. By respectively configuring the first PEDOT:PSS conductive film layer, the second PEDOT:PSS conductive film layer, the third PEDOT:PSS conductive film layer in the red OLED element, the green OLED element, the blue OLED element, and setting the first PEDOT:PSS conductive film layer, the second PEDOT:PSS conductive film layer, the third PEDOT:PSS conductive film layer to have various thicknesses to realize that the luminous efficiencies of the red OLED element, the green OLED element, the blue OLED element respectively achieve the best, and all the first PEDOT:PSS conductive film layer, the second PEDOT:PSS conductive film layer, the third PEDOT:PSS conductive film layer are manufactured by the ink jet printing method, and the production cost is low and the process is simple. In comparison with the traditional OLED display device, the thicknesses of the first hole transporting layer, the second hole transporting layer, the third hole transporting layer in the red OLED element, the green OLED element, the blue OLED element are the same in the OLED display device of the present invention, thus they can be formed in the same evaporation process with one common metal mask (CMM) to eliminate three fine metal masks to lower the production cost and decrease the process time.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:
1. An OLED display device, comprising a substrate, a pixel definition layer located on the substrate, a plurality of through holes located in the pixel definition layer, and a plurality of red OLED elements, a plurality of green OLED elements and a plurality of blue OLED elements, which are respectively located in the plurality of through holes;
the red OLED element comprising a first transparent conductive metal oxide layer, a first metal layer, a first PEDOT:PSS Poly(3,4-ethylenedioxythiophene)-poly(styrenesulfonate)) conductive film layer, a second transparent conductive metal oxide layer, a first hole injection layer, a first hole transporting layer, a red light emitting layer, a first electron transporting layer and a first cathode on the substrate from bottom to top in order; the first transparent conductive metal oxide layer, the first metal layer, the first PEDOT:PSS conductive film layer and the second transparent conductive metal oxide layer constituting a first anode, together;

the green OLED element comprising a third transparent conductive metal oxide layer, a second metal layer, a second PEDOT:PSS conductive film layer, a fourth transparent conductive metal oxide layer, a second hole injection layer, a second hole transporting layer, a green light emitting layer, a second electron transporting layer and a second cathode on the substrate from bottom to top in order; the third transparent conductive metal oxide layer, the second metal layer, the second PEDOT:PSS conductive film layer and the fourth transparent conductive metal oxide layer constituting a second anode, together;

the blue OLED element comprising a fifth transparent conductive metal oxide layer, a third metal layer, a third PEDOT:PSS conductive film layer, a sixth transparent conductive metal oxide layer, a third hole injection layer, a third hole transporting layer, a blue light emitting layer, a third electron transporting layer and a third cathode on the substrate from bottom to top in order; the fifth transparent conductive metal oxide layer, the third metal layer, the third PEDOT:PSS conductive film layer and the sixth transparent conductive metal oxide layer constituting a third anode, together;

wherein materials of the first transparent conductive metal oxide layer, the second transparent conductive metal oxide layer, the third transparent conductive metal oxide layer, the fourth transparent conductive metal oxide layer, the fifth transparent conductive metal oxide layer, the sixth transparent conductive metal oxide layer are tin indium oxide, and materials of the first metal layer, the second metal layer, the third metal layer are silver;

materials of the first cathode, the second cathode, the third cathode are the same, and comprise at least one of low work function metal, alloy formed by low work function metal and at least one of copper, gold, and silver, low work function metal nitride and low work function metal fluoride; the low work function metal comprises at least one of lithium, magnesium, calcium, strontium, aluminum and indium;

materials of the first hole injection layer, the second hole injection layer, the third hole injection layer comprise $HAT(CN)_6$, and a constitutional formula of $HAT(CN)_6$ is

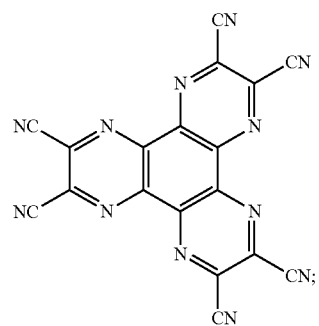 [SMILES: N#Cc1nc2c3nc(C#N)c(C#N)nc3c3nc(C#N)c(C#N)nc3c2nc1C#N]

materials of the first electron transporting layer, the second electron transporting layer, the third electron transporting layer are the same, and comprise BPhen, and a constitutional formula of BPhen is

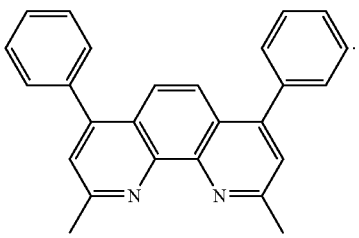 [SMILES: Cc1cc(-c2ccccc2)c2ccc3c(-c4ccccc4)cc(C)nc3c2n1]

2. The OLED display device according to claim 1, wherein materials of the first PEDOT:PSS conductive film layer, the second PEDOT:PSS conductive film layer, the third PEDOT:PSS conductive film layer are the same, and a refractive index thereof is $\eta_P$, and materials of the second transparent conductive metal oxide layer, the fourth transparent conductive metal oxide layer, the sixth transparent conductive metal oxide layer are the same, and a refractive index thereof is $\eta_I$, and materials of the first hole injection layer, the second hole injection layer, the third hole injection layer are the same, and a refractive index thereof is $\eta_J$, and materials of the first hole transporting layer, the second hole transporting layer, the third hole transporting layer are the same, and a refractive index thereof is $\eta_T$, and a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$;

a thickness of the first PEDOT:PSS conductive film layer is defined to be $d_{RP}$, and a thickness of the second transparent conductive metal oxide layer is defined to be $d_{RI}$, and a thickness of the first hole injection layer is defined to be $d_{RJ}$, and a thickness of the first hole transporting layer is defined to be $d_{RT}$, and a relation of $d_{RP}$, $d_{RI}$, $d_{RJ}$, $d_{RT}$ satisfies a relationship:

$$\eta_P*d_{RP}+\eta_I*d_{RI}+\eta_J*d_{RJ}+\eta_T*d_{RT}=(2m_R+1)\lambda_R/4;$$

wherein $m_R$ is a natural number;

a thickness of the second PEDOT:PSS conductive film layer is defined to be $d_{GP}$, and a thickness of the fourth transparent conductive metal oxide layer is defined to be $d_{GI}$, and a thickness of the second hole injection layer is defined to be $d_{GJ}$, and a thickness of the second hole transporting layer is defined to be $d_{GT}$, and a relation of $d_{GP}$, $d_{GI}$, $d_{GJ}$, $d_{GT}$ satisfies a relationship:

$$\eta_P*d_{GP}+\eta_I*d_{GI}+\eta_J*d_{GJ}+\eta_T*d_{GT}=(2m_G+1)\lambda_G/4;$$

wherein $m_G$ is a natural number;

a thickness of the third PEDOT:PSS conductive film layer is defined to be $d_{BP}$, and a thickness of the sixth transparent conductive metal oxide layer is defined to be $d_{BI}$, and a thickness of the third hole injection layer is defined to be $d_{BJ}$, and a thickness of the third hole transporting layer is defined to be $d_{BT}$, and a relation of $d_{BP}$, $d_{BI}$, $d_{BJ}$, $d_{BT}$ satisfies a relationship:

$$\eta_P*d_{BP}+\eta_I*d_{BI}+\eta_J*d_{BJ}+\eta_T*d_{BT}=(2m_B+1)\lambda_B/4;$$

wherein $m_B$ is a natural number;
and $d_{RI}=d_{GI}=d_{BI}$, $d_{RJ}=d_{GJ}=d_{BJ}$, $d_{RT}=d_{GT}=d_{BT}$, $m_R=m_G=m_B$, and $\lambda_R$, $\lambda_G$, $\lambda_B$ are unequal, and thus, $d_{RP}$, $d_{GP}$, $d_{BP}$ are unequal.

3. The OLED display device according to claim 1, wherein the plurality of through holes in the pixel definition layer appear to be tapered, and a dimension of the through hole gradually increases from one end away from the substrate to one end close to the substrate.

4. The OLED display device according to claim 1, wherein the red light emitting layer comprises a main material and a doped dye, and the main material is CBP, and the doped dye is red phosphorescent dye, and the red phosphorescent dye is Ir(DBQ)$_2$(acac);

the green light emitting layer comprises a main material and a doped dye, and the main material is CBP, and the doped dye is green phosphorescent dye, and the green phosphorescent dye is Ir(ppy)$_3$;

the blue light emitting layer comprises a main material and a doped dye, and the main material is AND, and the doped dye is blue fluorescent dye, and the blue fluorescent dye is BUBD-1;

a constitutional formula of CBP is

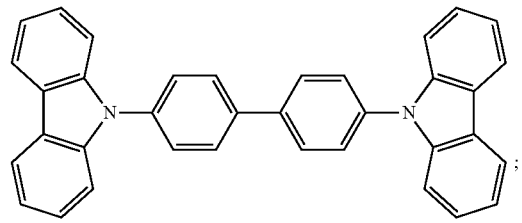 [SMILES: c1ccc2c(c1)c1ccccc1n2-c1ccc(-c2ccc(-n3c4ccccc4c4ccccc43)cc2)cc1]

a constitutional formula of Ir(DBQ)$_2$(acac) is

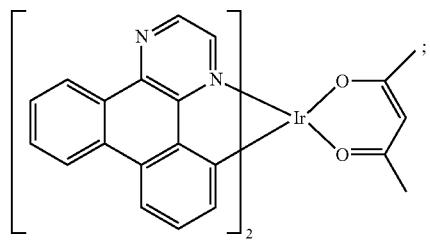

a constitutional formula of Ir(ppy)$_3$ is

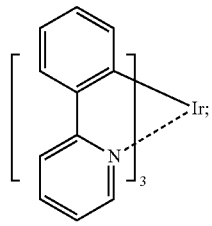

a constitutional formula of BUBD-1 is

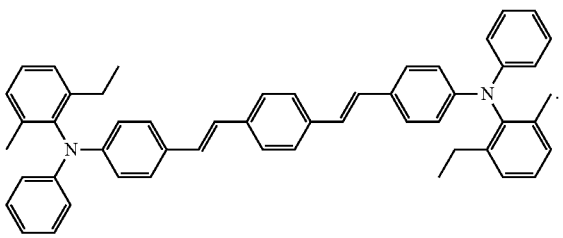 [SMILES: CCc1cccc(C)c1N(c1ccccc1)c1ccc(/C=C/c2ccc(/C=C/c3ccc(N(c4ccccc4)c4c(C)cccc4CC)cc3)cc2)cc1]

5. A manufacture method of an OLED display device, comprising steps of:

step 1, providing a substrate, and forming a pixel definition layer on the substrate, and configuring a plurality of through holes which are separately located in the pixel definition layer, and the plurality of through holes defining a plurality of red pixel regions, a plurality of green pixel regions and a plurality of blue pixel regions on the substrate;

respectively forming a first transparent conductive metal oxide layer, a third transparent conductive metal oxide layer, a fifth transparent conductive metal oxide layer in the red pixel region, the green pixel region and the blue pixel region of the substrate;

respectively forming a first metal layer, a second metal layer, a third metal layer on the first transparent conductive metal oxide layer, the third transparent conductive metal oxide layer, the fifth transparent conductive metal oxide layer;

respectively coating PEDOT:PSS (Poly(3,4-ethylenedioxythiophene)-poly(styrenesulfonate)) aqueous solution on the first metal layer, the second metal layer and the third metal layer, and forming a first PEDOT:PSS conductive film layer, a second PEDOT:PSS conductive film layer, a third PEDOT:PSS conductive film layer after curing and removing moisture;

respectively depositing a second transparent conductive metal oxide layer, a fourth transparent conductive metal oxide layer, a sixth transparent conductive metal oxide layer on the first PEDOT:PSS conductive film layer, the second PEDOT:PSS conductive film layer, the third PEDOT:PSS conductive film layer;

in the red pixel region, the first transparent conductive metal oxide layer, the first metal layer, the first PEDOT:PSS conductive film layer and the second transparent conductive metal oxide layer which are stacked up from bottom to top in order constituting a first anode, together;

in the green pixel region, the third transparent conductive metal oxide layer, the second metal layer, the second PEDOT:PSS conductive film layer and the fourth transparent conductive metal oxide layer which are stacked up from bottom to top in order constituting a second anode, together;

in the blue pixel region, the fifth transparent conductive metal oxide layer, the third metal layer, the third PEDOT:PSS conductive film layer and the sixth transparent conductive metal oxide layer which are stacked up from bottom to top in order constituting a third anode, together;

step 2, cleaning the first anode, the second anode and the third anode;

step 3, respectively evaporating a first hole injection layer, a second hole injection layer, a third hole injection layer on the first anode, the second anode and the third anode in the same evaporation process;

respectively evaporating a first hole transporting layer, a second hole transporting layer, a third hole transporting layer on the first hole injection layer, the second hole injection layer, the third hole injection layer in the same evaporation process;

respectively evaporating a red light emitting layer, a green light emitting layer, a blue light emitting layer on the first hole transporting layer, the second hole transporting layer, the third hole transporting layer in three different evaporation processes;

respectively evaporating a first electron transporting layer, a second electron transporting layer, a third electron transporting layer on the red light emitting layer, the green light emitting layer, the blue light emitting layer in the same evaporation process;

respectively evaporating a first cathode, a second cathode, a third cathode on the first electron transporting layer, the second electron transporting layer, the third electron transporting layer in the same evaporation process;

and forming red OLED elements, green OLED elements and blue OLED elements respectively corresponding to the red pixel regions, the green pixel regions, the blue pixel regions in the plurality of through holes of the pixel definition layer;

wherein materials of the first PEDOT:PSS conductive film layer, the second PEDOT:PSS conductive film layer, the third PEDOT:PSS conductive film layer are the same, and a refractive index thereof is $\eta_P$, and materials of the second transparent conductive metal oxide layer, the fourth transparent conductive metal oxide layer, the sixth transparent conductive metal oxide layer are the same, and a refractive index thereof is $\eta_I$, and materials of the first hole injection layer, the second hole injection layer, the third hole injection layer are the same, and a refractive index thereof is $\eta_J$, and materials of the first hole transporting layer, the second hole transporting layer, the third hole transporting layer are the same, and a refractive index thereof is $\eta_T$, and a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$;

a thickness of the first PEDOT:PSS conductive film layer is defined to be $d_{RP}$, and a thickness of the second transparent conductive metal oxide layer is defined to be $d_{RI}$, and a thickness of the first hole injection layer is defined to be $d_{RJ}$, and a thickness of the first hole transporting layer is defined to be $d_{RT}$, and a relation of $d_{RP}$, $d_{RI}$, $d_{RJ}$, $d_{RT}$ satisfies a relationship:

$$\eta_P{}^*d_{RP}+\eta_I{}^*d_{RI}+\eta_J{}^*d_{RJ}+\eta_T{}^*d_{RT}=(2m_R+1)\lambda_R/4;$$

wherein $m_R$ is a natural number;

a thickness of the second PEDOT:PSS conductive film layer is defined to be $d_{GP}$, and a thickness of the fourth transparent conductive metal oxide layer is defined to be $d_{GI}$, and a thickness of the second hole injection layer is defined to be $d_{GJ}$, and a thickness of the second hole transporting layer is defined to be $d_{GT}$, and a relation of $d_{GP}$, $d_{GI}$, $d_{GT}$ satisfies a relationship:

$$\eta_P{}^*d_{GP}+\eta_I{}^*d_{GI}+\eta_{GJ}{}^*d_{GJ}+\eta_T{}^*d_{GT}+(2m_G+1)\lambda_G/4;$$

wherein $m_G$ is a natural number;

a thickness of the third PEDOT:PSS conductive film layer is defined to be $d_{BP}$, and a thickness of the sixth transparent conductive metal oxide layer is defined to be $d_{BI}$, and a thickness of the third hole injection layer is defined to be $d_{BJ}$, and a thickness of the third hole transporting layer is defined to be $d_{BT}$, and a relation of $d_{BP}$, $d_{BI}$, $d_{BJ}$, $d_{BT}$ satisfies a relationship:

$$\eta_P{}^*d_{BP}+\eta_I{}^*d_{BI}+\eta_J{}^*d_{BJ}+\eta_T{}^*d_{BT}=(2m_B+1)\lambda_B/4;$$

wherein $m_B$ is a natural number;

and $d_{RI}=d_{GI}=d_{BI}$, $d_{RJ}=d_{GJ}=d_{BJ}$, $d_{RT}=d_{GT}=d_{BT}$, $m_R=m_G=m_B$, and $\lambda_R$, $\lambda_G$, $\lambda_B$ are unequal, and thus, $d_{RP}$, $d_{GP}$, $d_{BP}$ are unequal.

6. The manufacture method of the OLED display device according to claim 5, wherein the plurality of through holes in the pixel definition layer appear to be tapered, and a dimension of the through hole gradually increases from one end away from the substrate to one end close to the substrate.

7. The manufacture method of the OLED display device according to claim 5, wherein;
in step 1, a magnetron sputtering method is used to deposit the first transparent conductive metal oxide layer, the second transparent conductive metal oxide layer, the third transparent conductive metal oxide layer, the fourth transparent conductive metal oxide layer, the fifth transparent conductive metal oxide layer, the sixth transparent conductive metal oxide layer, and the first metal layer, the second metal layer, the third metal layer are silver;
an ink jet printing method is used to respectively coat PEDOT:PSS aqueous solution on the first metal layer, the second metal layer and the third metal layer.

8. The manufacture method of the OLED display device according to claim 5, wherein the red light emitting layer comprises a main material and a doped dye, and the main material is CBP, and the doped dye is red phosphorescent dye, and the red phosphorescent dye is Ir(DBQ)$_2$(acac);
the green light emitting layer comprises a main material and a doped dye, and the main material is CBP, and the doped dye is green phosphorescent dye, and the green phosphorescent dye is Ir(ppy)$_3$;
the blue light emitting layer comprises a main material and a doped dye, and the main material is AND, and the doped dye is blue fluorescent dye, and the blue fluorescent dye is BUBD-1;
a constitutional formula of CBP is

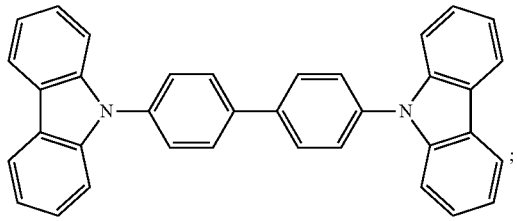 [SMILES: c1ccc2c(c1)c1ccccc1n2-c1ccc(-c2ccc(-n3c4ccccc4c4ccccc43)cc2)cc1]

a constitutional formula of Ir(DBQ)$_2$(acac) is

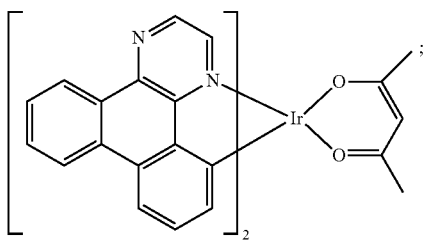

a constitutional formula of Ir(ppy)$_3$ is

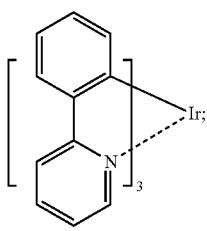

a constitutional formula of BUBD-1 is

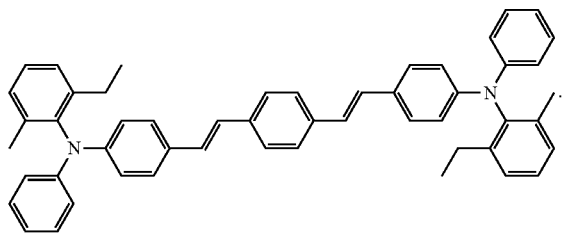 [SMILES: CCc1cccc(C)c1N(c1ccccc1)c1ccc(/C=C/c2ccc(/C=C/c3ccc(N(c4ccccc4)c4c(C)cccc4CC)cc3)cc2)cc1]

9. A manufacture method of an OLED display device, comprising steps of:
step 1, providing a substrate, and forming a pixel definition layer on the substrate, and configuring a plurality of through holes which are separately located in the pixel definition layer, and the plurality of through holes defining a plurality of red pixel regions, a plurality of green pixel regions and a plurality of blue pixel regions on the substrate;
respectively forming a first transparent conductive metal oxide layer, a third transparent conductive metal oxide layer, a fifth transparent conductive metal oxide layer in the red pixel region, the green pixel region and the blue pixel region of the substrate;
respectively forming a first metal layer, a second metal layer, a third metal layer on the first transparent conductive metal oxide layer, the third transparent conductive metal oxide layer, the fifth transparent conductive metal oxide layer;
respectively coating PEDOT:PSS (Poly(3,4-ethylenedioxythiophene)-poly(styrenesulfonate)) aqueous solution on the first metal layer, the second metal layer and the third metal layer, and forming a first PEDOT:PSS conductive film layer, a second PEDOT:PSS conductive film layer, a third PEDOT:PSS conductive film layer after curing and removing moisture;
respectively depositing a second transparent conductive metal oxide layer, a fourth transparent conductive metal oxide layer, a sixth transparent conductive metal oxide layer on the first PEDOT:PSS conductive film layer, the second PEDOT:PSS conductive film layer, the third PEDOT:PSS conductive film layer;
in the red pixel region, the first transparent conductive metal oxide layer, the first metal layer, the first PEDOT:PSS conductive film layer and the second transparent conductive metal oxide layer which are stacked up from bottom to top in order constituting a first anode, together;
in the green pixel region, the third transparent conductive metal oxide layer, the second metal layer, the second PEDOT:PSS conductive film layer and the fourth transparent conductive metal oxide layer which are stacked up from bottom to top in order constituting a second anode, together;
in the blue pixel region, the fifth transparent conductive metal oxide layer, the third metal layer, the third PEDOT:PSS conductive film layer and the sixth transparent conductive metal oxide layer which are stacked up from bottom to top in order constituting a third anode, together;

step 2, cleaning the first anode, the second anode and the third anode;

step 3, respectively evaporating a first hole injection layer, a second hole injection layer, a third hole injection layer on the first anode, the second anode and the third anode in the same evaporation process;

respectively evaporating a first hole transporting layer, a second hole transporting layer, a third hole transporting layer on the first hole injection layer, the second hole injection layer, the third hole injection layer in the same evaporation process;

respectively evaporating a red light emitting layer, a green light emitting layer, a blue light emitting layer on the first hole transporting layer, the second hole transporting layer, the third hole transporting layer in three different evaporation processes;

respectively evaporating a first electron transporting layer, a second electron transporting layer, a third electron transporting layer on the red light emitting layer, the green light emitting layer, the blue light emitting layer in the same evaporation process;

respectively evaporating a first cathode, a second cathode, a third cathode on the first electron transporting layer, the second electron transporting layer, the third electron transporting layer in the same evaporation process;

and forming red OLED elements, green OLED elements and blue OLED elements respectively corresponding to the red pixel regions, the green pixel regions, the blue pixel regions in the plurality of through holes of the pixel definition layer;

wherein materials of the first PEDOT:PSS conductive film layer, the second PEDOT:PSS conductive film layer, the third PEDOT:PSS conductive film layer are the same, and a refractive index thereof is $\eta_P$, and materials of the second transparent conductive metal oxide layer, the fourth transparent conductive metal oxide layer, the sixth transparent conductive metal oxide layer are the same, and a refractive index thereof is $\eta_I$, and materials of the first hole injection layer, the second hole injection layer, the third hole injection layer are the same, and a refractive index thereof is $\eta_J$, and materials of the first hole transporting layer, the second hole transporting layer, the third hole transporting layer are the same, and a refractive index thereof is $\eta_T$, and a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$;

a thickness of the first PEDOT:PSS conductive film layer is defined to be $d_{RP}$, and a thickness of the second transparent conductive metal oxide layer is defined to be $d_{RI}$, and a thickness of the first hole injection layer is defined to be $d_{RJ}$, and a thickness of the first hole transporting layer is defined to be $d_{RT}$, and a relation of $d_{RP}$, $d_{RI}$, $d_{RJ}$, $d_{RT}$ satisfies a relationship:

$$\eta_P*d_{RP}+\eta_I*d_{RI}+\eta_J*d_{RJ}+\eta_T*d_{RT}=(2m_R+1)\lambda_R/4;$$

wherein $m_R$ is a natural number;

a thickness of the second PEDOT:PSS conductive film layer is defined to be $d_{GP}$, and a thickness of the fourth transparent conductive metal oxide layer is defined to be $d_{GI}$, and a thickness of the second hole injection layer is defined to be $d_{GJ}$, and a thickness of the second hole transporting layer is defined to be $d_{GT}$, and a relation of $d_{GP}$, $d_{GI}$, $d_{GJ}$, $d_{GT}$ satisfies a relationship:

$$\eta_P*d_{GP}+\eta_I*d_{GI}+\eta_J*d_{GJ}+\eta_T*d_{GT}=(2m_G+1)\lambda_G/4;$$

wherein $m_G$ is a natural number;

a thickness of the third PEDOT:PSS conductive film layer is defined to be $d_{BP}$, and a thickness of the sixth transparent conductive metal oxide layer is defined to be $d_{BI}$, and a thickness of the third hole injection layer is defined to be $d_{BJ}$, and a thickness of the third hole transporting layer is defined to be $d_{BT}$, and a relation of $d_{BP}$, $d_{BI}$, $d_{BJ}$, $d_{BT}$ satisfies a relationship:

$$\eta_P*d_{BP}+\eta_I*d_{BI}+\eta_J*d_{BJ}+\eta_T*d_{BT}=(2m_B+1)\lambda_B/4;$$

wherein $m_B$ is a natural number;

and $d_{RI}=d_{GI}=d_{BI}$, $d_{RJ}=d_{GJ}=d_{BJ}$, $d_{RT}=d_{GT}=d_{BT}$, $m_R=m_G=m_B$, and $\lambda_R$, $\lambda_G$, $\lambda_B$ are unequal, and thus, $d_{RP}$, $d_{GP}$, $d_{BP}$ are unequal;

wherein the plurality of through holes in the pixel definition layer appear to be tapered, and a dimension of the through hole gradually increases from one end away from the substrate to one end close to the substrate;

wherein the red light emitting layer comprises a main material and a doped dye, and the main material is CBP, and the doped dye is red phosphorescent dye, and the red phosphorescent dye is $Ir(DBQ)_2(acac)$;

the green light emitting layer comprises a main material and a doped dye, and the main material is CBP, and the doped dye is green phosphorescent dye, and the green phosphorescent dye is $Ir(ppy)_3$;

the blue light emitting layer comprises a main material and a doped dye, and the main material is AND, and the doped dye is blue fluorescent dye, and the blue fluorescent dye is BUBD-1;

a constitutional formula of CBP is

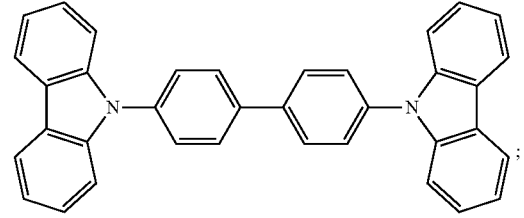 [SMILES: c1ccc2c(c1)c1ccccc1n2-c1ccc(-c2ccc(-n3c4ccccc4c4ccccc43)cc2)cc1]

a constitutional formula of Ir(DBQ)₂(acac) is

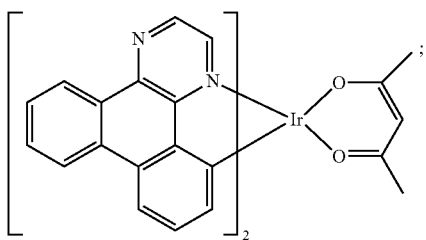

a constitutional formula of Ir(ppy)₃ is

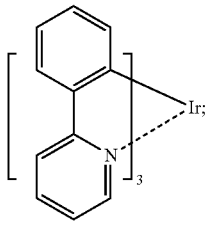

a constitutional formula of BUBD-1 is

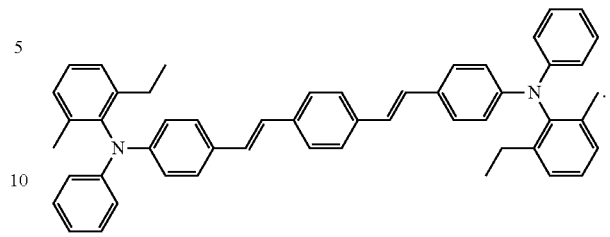

10. The manufacture method of the OLED display device according to claim 9, wherein;
in step 1, a magnetron sputtering method is used to deposit the first transparent conductive metal oxide layer, the second transparent conductive metal oxide layer, the third transparent conductive metal oxide layer, the fourth transparent conductive metal oxide layer, the fifth transparent conductive metal oxide layer, the sixth transparent conductive metal oxide layer, and the first metal layer, the second metal layer, the third metal layer are silver;
an ink jet printing method is used to respectively coat PEDOT:PSS aqueous solution on the first metal layer, the second metal layer and the third metal layer.

* * * * *